United States Patent [19]

Yokoyama et al.

[11] Patent Number: 5,304,868
[45] Date of Patent: Apr. 19, 1994

[54] NON-INVERTING BUFFER CIRCUIT DEVICE AND SEMICONDUCTOR MEMORY CIRCUIT DEVICE

[75] Inventors: Yuji Yokoyama, Hitachi; Kazuyuki Miyazawa, Iruma; Hitoshi Miwa, Ome; Shoji Wada, Tokyo, all of Japan

[73] Assignees: Hitachi, Ltd., Tokyo; Hitachi VLSI Engineering Corp., Kodaira, both of Japan

[21] Appl. No.: 783,781

[22] Filed: Oct. 29, 1991

[30] Foreign Application Priority Data

Nov. 1, 1990 [JP] Japan .................................. 2-293727

[51] Int. Cl.$^5$ ........................ H03K 19/02; G11C 8/00
[52] U.S. Cl. .................................... 307/446; 307/570; 365/230.08
[58] Field of Search .......... 307/446, 570, 272.1–272.3; 365/230.01, 230.08, 189.05

[56] References Cited

U.S. PATENT DOCUMENTS

| | | | |
|---|---|---|---|
| 4,558,234 | 12/1985 | Suzuri et al. | 307/446 |
| 4,948,994 | 8/1990 | Akioka et al. | 307/451 |
| 5,001,366 | 3/1991 | Masuda et al. | 307/446 |
| 5,097,150 | 3/1992 | Satou et al. | 307/446 |

Primary Examiner—Edward P. Westin
Assistant Examiner—Andrew Sanders
Attorney, Agent, or Firm—Antonelli, Terry, Stout & Kraus

[57] ABSTRACT

A non-inverting buffer circuit device suited for an input buffer circuit of a semiconductor memory is provided so that the number of logic gate stages can be reduced to realize a high speed operation. The circuit is designed in such a way that an MOS transistor at an input stage drives a bipolar transistor at an output stage to produce an output. An n-channel MOS transistor and a p-channel MOS transistor connected in parallel between the base and the collector of the bipolar transistor are on-/off controlled by an inverted signal of the input digital signal and a non-inverted signal thereof, respectively. In another aspect, the input buffer circuit includes an inverted signal outputting circuit, and a non-inverted signal outputting circuit in the set mode the input signal in the non-inverted state and outputting in the reset mode the signal at the prescribed potential. The inverted signal outputting circuit includes a bipolar transistor producing an output signal at its collector potential, a first switching circuit for controlling supply of a collector current to the bipolar transistor, an n-channel MOS transistor, connected in parallel between the base and the collector of the bipolar transistor, for supplying a base current to the bipolar transistor in accordance with the input signal, and a second switching circuit for controlling supply of the base current to the bipolar transistor, wherein the first switching circuit and the second switching circuit are selectively on-off controlled.

21 Claims, 15 Drawing Sheets

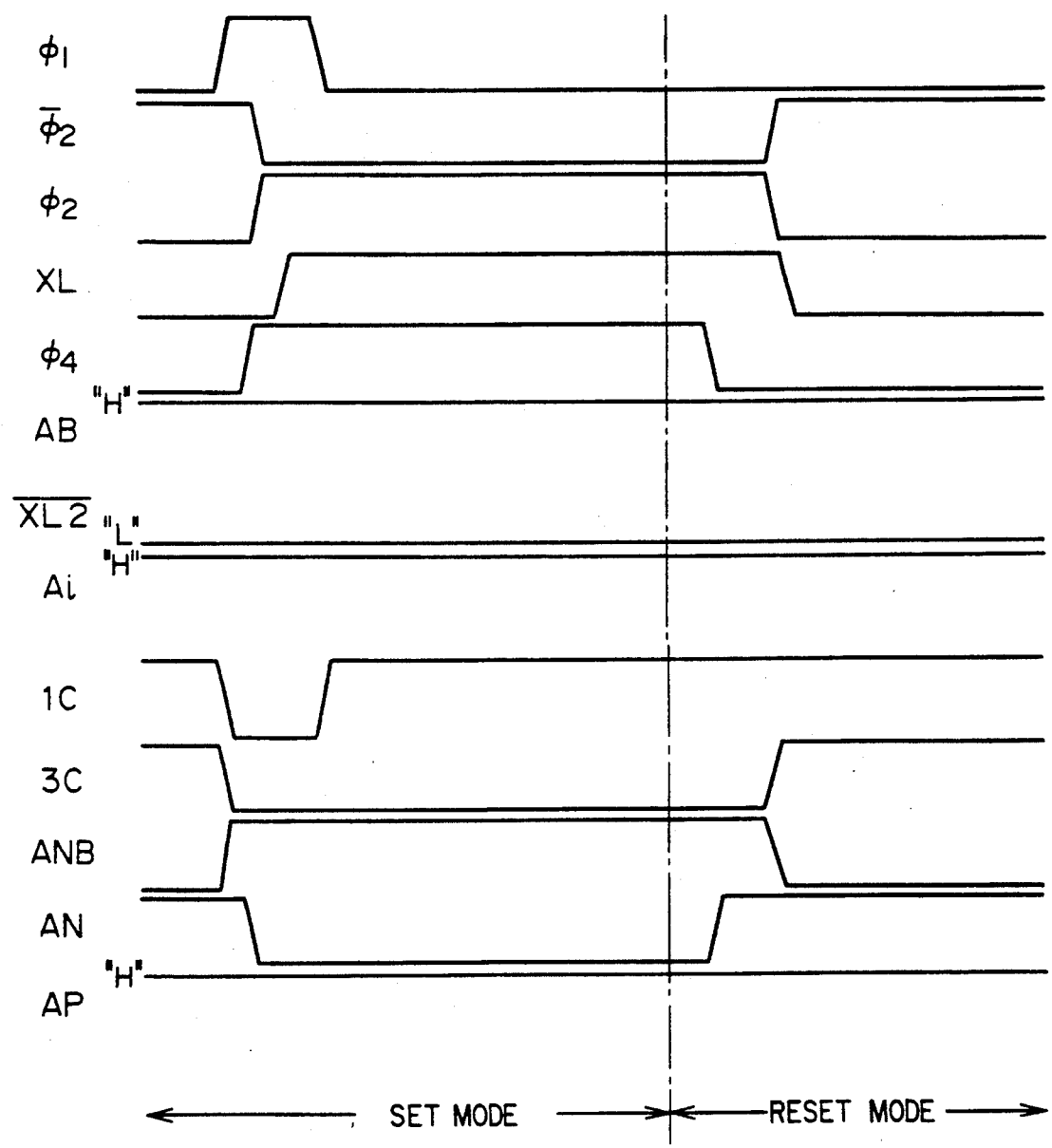
FIG. IC

NON-INVERTING BUFFER CIRCUIT DEVICE AND SEMICONDUCTOR MEMORY CIRCUIT DEVICE

BACKGROUND OF THE INVENTION

The present invention relates to a non-inverting buffer device and a semiconductor storage device, and more particularly to a non-inverting buffer circuit device and a semiconductor storage circuit device with a high operation speed.

A general dynamic type semiconductor memory (hereinafter referred to as DRAM) to which the present invention can be applied would typically include an input buffer circuit, a row decoder circuit, a column decoder circuit, a memory cell array, an amplifier circuit and an output buffer circuit. FIG. 8 is a block diagram of an example of such a DRAM. In FIG. 8, in accordance with an addressing signal Ai, an input buffer circuit 10 supplies a signal for addressing to both the row decoder circuit 11 and the column decoder circuit 12. An amplifier circuit 13 and an output buffer circuit 14 are also provided. A row address decoder circuit 11 and a column decoder circuit 12 supplies a row address and a column address to a memory cell array 15, respectively.

The memory cell array 15 is composed of memory cells arranged in a matrix shape of $2^M \times 2^N$ (M, N are positive integers). The amplifier circuit 13 amplifies the signal from the memory cell array 15 to send the amplified signal to the output buffer circuit 14. The output buffer circuit 14 sends an input signal from the memory cell array 15 to a succeeding stage circuit.

Generally, high speed operation has been demanded for semiconductor memories. The operation speed is defined by the time taken from when the address signal Ai is inputted to the input buffer circuit 10 to the time when the information stored in the memory cell selected by the address signal Ai is read out from the output buffer circuit 14 (now called 'delay time'), i.e., an access time.

The access time can be shortened by enhancing the operation speed of each of the components of the semiconductor memory. Particularly, realizing the high speed operation of the input buffer circuit 10 is very effective because it contributes to the high speed operation of each of the succeeding stage circuits (the row decoder circuit 11, column decoder circuit 12 and memory cell array 12) as well as the high speed operation of itself.

The input buffer circuit for a DRAM, as described later with reference to FIGS. 2A and 2B, is required to have, as its characteristic functions, (1) a complementary signal outputting function, (2) an output latch function, (3) a set/reset function and (4) a refresh function.

(1) The complementary signal outputting function is to output two output signals AN and AP (hereinafter, as the case may be, both output signals AN and AP may be expressed as a complementary signal) indicative of different logic levels.

(2) The output latch function is to latch a complementary signal outputted in accordance with the address signal Ai to fix the output regardless of a change in the address signal Ai.

(3) The set/reset function is a switch over function to either send the complementary signals according to the address signal Ai to the respective succeeding stage decoder circuits 11 and 12 to output desired data at a memory cell (set mode) or, on the contrary, to send fixed signals both of which are at a 'H' (or 'L') level regardless of the address signal Ai to the respective decoder circuits 11 and 12 so that selection of the memory cell by the decoder circuits is inhibited to place DRAM in a standby state (reset mode).

(4) The refresh function is to rewrite the storage contents of a memory cell (e.g. for 2-3 ms) to prevent the stored data from being destroyed.

FIG. 2A shows the circuit structure of the input buffer circuit 10 for the conventional DRAM in its block form, and FIG. 2B is the corresponding timing chart.

The input buffer circuit for DRAM is mainly composed of a level inverting circuit section, a complementary signal creating circuit section, an isolation circuit unit, a refresh address input circuit stage (section), a self-latch circuit stage (section) and a driver circuit stage (section).

The level inverting section is constructed by a two-input NAND gate IC1 for inverting, in response to input signals of an address signal and a control signal $\phi$, the logical level (e.g. 0-3 V) of the address signal Ai to that suitable for the DRAM (e.g. 0-5 V) so that if the control signal $\phi$ is at a logical low 'L' level, the output signal is fixed at a logical high 'H' level regardless of the value of the address signal Ai and if the control signal $\phi$ is at the 'H' level, the inverted signal of the address signal Ai is outputted.

The complementary signal creating circuit is composed of an inverter IC2 and two NAND gates IC3a and IC3b. In the set mode, the control signal $\phi$ is at the 'H' level so that the inverting signal of the address signal Ai is outputted from IC3a and the non-inverting is outputted from IC3b. In the reset mode, the control signal $\phi$ is at the 'L' level so that both outputs from IC3a and IC3b are at the 'H' level regardless of the value of the address signal Ai. Incidentally, the circuit structures after IC3a and IC3b are entirely the same on both sides of the inverting output and non-inverting output so that the explanation will be given of only the inverting output side.

The isolation circuit section is a clocked inverter IC4 composed of p-channel MOS transistors (hereinafter referred to as pMOS) Q1, Q3 and n-channel MOS transistor (hereinafter referred to as nMOS) Q2, Q4. If a control signal $\phi 2$ is at the 'H' level ($\overline{\phi 2}$ is at the 'L' level), Q3 and Q4 turn on so that the separation circuit serves as an inverter, whereas if the control signal $\phi 2$ is at the 'L' level, Q3 and Q4 turn off so that the separation circuit serves as an isolation circuit. The control signal $\phi 2$ falls (i.e. 'L' level) during the period when the control signal $\phi 1$ is at the H level. Thus, the output potential of the separation section on the inverting output side is held at the non-inverting output potential of the address signal Ai while that on the non-inverting output is held at the inverting output potential of the address signal Ai.

The refresh address input circuit section N3 produces an address signal corresponding to a refresh address.

The self-latch circuit N4 latches the output potential of the isolation circuit section after the control signal $\phi 2$ has fallen and sends the latched potential to the driver circuit section.

The driver circuit section N5 converts the signal inputted in accordance with the address signal Ai. Thus, it outputs the inverted signal of the address signal Ai from the inverting output side and the non-inverted signal of the address signal Ai from the non-inverting output side. Additionally, a capacitor having a relatively large capacitance of 2-3 pF is connected with the output from the driver circuit for the DRAM. In comparing of the delay times due to the different load capacitances for a MOS transistor and a bipolar transistor, as seen from FIG. 3 as disclosed in the pending application U.S. Ser. No. 462,986 filed Jan. 10, 1990, if the load capacitance is relatively large, the BiCMOS circuit, the output stage of which is constructed by a bipolar transistor, provides a higher operation speed. For this reason, in most cases, the driver circuit section N5 DRAM is designed in a BiCMOS structure composed of, e.g., a CMOS inverter and a bipolar transistor Tr1 as shown in FIG. 2.

The above prior art has the following problems to be solved.

The delay time generated in the input buffer circuit is the sum of the time required for the gate insulating film of each of logic gates constituting it to be charged/discharged by an input signal and to charge/discharge the output load capacitance by an output signal. The delay time generated in the entire input buffer circuit, therefore, is substantially determined by the number of logic gates. Accordingly, by reducing the number of logic gates from the input section to the output section of the input buffer circuit, the operation speed can be improved.

On the inverting output side, the input buffer circuit of the above prior art has the following 5 (five) logic gates from its input section to output section:
the first stage: the level converter circuit section IC1:
the second stage: the complementary signal creating circuit IC2:
the third stage: the complementary signal creating circuit IC3a:
the fourth stage: the isolation circuit unit IC4:
the fifth stage: the driver circuit IC5.

On the other hand, on the non-inverting output side, the inverter IC2 of the complementary signal creating circuit section is not required in contrast to the inverting output side, the input buffer circuit has only to have the following 4 (four) logic gates:
the first stage the level converter circuit section IC1:
the second stage: the complementary signal creating section IC3b
the third stage: the isolation circuit section IC4; and
the fourth stage: the driver circuit section IC5

Now it should be noted that the delay time of the entire input buffer circuit is determined by the number of logic gates on the inverting output side having more logic gates so that the prior art input buffer circuit substantially has five logic gate stages. Therefore, if the input buffer circuit is designed to have the smaller number of logic gates than 5, an input buffer capable of operating at a higher speed than before can be realized.

Further, the above prior art, in which the inverting output side and the non-inverting output side have different numbers of logic gate stages, provides a difference in the delay time between complementary signals AN and AP. The presence of this difference in the delay times for the complementary signals, which are supplied to the decoder circuits, may generate a hazard in the decoder circuit, thereby badly influencing the circuit operation.

The difference in the number of logic gates can be obviated by inserting an non-inverting buffer of one stage of a logic gate on the non-inverting output side having a smaller number of logic gates without substantially increasing the number of logic gates in the input buffer circuit.

However, the operation speed of the non-inverting buffer circuit of one logic gate stage is slower than that of the inverting buffer circuit, as described below in detail. Therefore, coincidence in the number of logic gates does not lead to that in the delay time; on the contrary, the delay time will be increased.

Now, the problem attendant on the conventional non-inverting buffer will be explained in connection with the case where the driver circuit N5 is designed in the non-inverting buffer circuit in a BiCMOS structure in which a pMOS Q51 is connected between the base and the collector of a bipolar transistor Tr 51 as shown in FIG. 5.

In FIG. 5, when an input signal $V_{IN}$ shifts from the 'H' level to the 'L' level, Q51 also shifts from the off-state to on-state. Then, the base current is supplied to Tr51 so that Tr51 turns on and so the collector current IC flows. Thus, the collector potential (output potential $V_{OUT}$) approaches the 'L' level. However, when the collector potential approaches (VBE+Vth) (sum of the base-emitter voltage and the threshold potential of Q51), Q51 performs a sub-threshold operation to greatly reduce the capability of supplying the base current. As a result, as shown in FIG. 6, the gradient of the collector potential $V_{OUT}$ becomes moderate in the neighborhood of the 'L' level. This increases the delay time and also generates the through-current in the logic gate of a MOS transistor connected with the succeeding stage thereby to increase current consumption.

SUMMARY OF THE INVENTION

An object of the present invention is to solve the above problems to provide a non-inverting buffer circuit of one stage of logic gate capable of performing a high speed operation.

Another object of the present invention is to reduce the number of logic gates from the input to output section of an input buffer circuit which is one component of a semiconductor memory thereby to provide a semiconductor memory circuit operable at a high speed.

Still another object of the present invention is to apply the above non-inverting buffer circuit to the input buffer circuit of a semiconductor memory device to provide a semiconductor memory circuit device with the delay time equal on both inverting output and non-inverting output sides.

In order to attain the above objects, in accordance with one aspect of the present invention, there is provided a non-inverting buffer circuit device in which the MOS transistor at an input stage drives the bipolar transistor at an output stage to produce the signal at the same logic level as that of an input digital signal. An n-channel MOS transistor and a p-channel MOS transistor are connected in parallel between the base and the collector of the bipolar transistor and are on/off controlled by the inverted signal of the input digital signal and the non-inverted signal thereof, respectively.

In accordance with another aspect of the present invention, there is provided a semiconductor memory circuit device provided with an input buffer circuit including inverted signal outputting means for inverting in a set mode an input signal to be outputted, and outputting in a reset mode the signal at a prescribed potential, and non-inverted signal outputting means in the set mode the input signal in the non-inverted state and outputting in the reset mode the signal at the prescribed potential, wherein the inverted signal outputting means comprises a bipolar transistor producing an output signal at its collector potential, first switching means for controlling supply of a collector current to the bipolar transistor, an n-channel MOS transistor, connected in parallel between the base and the collector of the bipolar transistor, for supplying a base current to the bipolar transistor in accordance with the input signal, and second switching means for controlling supply of the base current to the bipolar transistor and the first switching means and the second switching means are selectively on-off controlled.

In accordance with still another aspect of the present invention, there is provided a semiconductor memory circuit device provided with an input buffer circuit including inverted signal outputting means for inverting in a set mode an input signal to be outputted, and outputting in a reset mode the signal at a prescribed potential, and non-inverted signal outputting means for outputting in the set mode the input signal in the non-inverted state and outputting in the reset mode the signal at the prescribed potential, wherein the inverted signal outputting means comprises a first bipolar transistor producing an output signal at its collector potential, a first switching means for controlling supply of a collector current to the first bipolar transistor, a first n-channel MOS transistor, connected in parallel between the base and the collector of the first bipolar transistor, for supplying a base current to the first bipolar transistor in accordance with the input signal, and a second switching means for controlling supply of the base current to the first bipolar transistor and wherein the non-inverted signal outputting means comprises a second bipolar transistor producing an output signal at its collector potential, a third switching means for controlling supply of a collector current to the second bipolar transistor, a second n-channel MOS transistor, connected in parallel between the base and the collector of the second bipolar transistor, for supplying a base current to the second bipolar transistor in accordance with the non-inverted signal of the input signal, a first p-channel MOS transistor, connected in parallel between the base and the collector of the second bipolar transistor, for supplying the base current to the second bipolar transistor in accordance with the non-inverted signal of an input digital signal and a fourth switching means for controlling supply of the base current to the second bipolar transistor, the second switching means and the fourth switching means being selectively on-off controlled.

In accordance with the arrangement of the first aspect of the present invention, if the gate-source voltage is relatively high, the base current is mainly supplied by the p-channel MOS transistor. On the other hand, if the gate-source voltage is relatively low, the base current is mainly supplied by the n-channel MOS transistor. Therefore, a sufficient amount of base current is always supplied to the bipolar transistor whether the gate-source voltage is high or low and the bipolar transistor can always pass a collector current. Therefore, if the output potential is controlled using the collector current, the output potential can be shifted swiftly so that the non-inverting buffer device capable of performing a high speed operation at only one logic gate state can be realized.

In accordance with the second and the third aspect of the present invention, the functions required by the input buffer circuit, the complementary signal output function, the set/reset mode switching function and the function of driving the circuit to be connected at a rear stage can be realized by only one logic gate stage so that the number of logic gate stages from the input section to output section of the input buffer circuit is reduced to realize the semiconductor memory circuit device operable at a high speed.

BRIEF DESCRIPTION OF THE DRAWINGS

FIG. 1C is a timing chart for explaining the circuit operation of the circuit of FIG. 1A;

DESCRIPTION OF THE PREFERRED EMBODIMENTS

First, the basic theory or technical idea of the present invention will be explained. In accordance with the present invention, in order to reduce the number of logic gate stages of an input buffer circuit which is one component of a semiconductor memory to realize the high speed operation of the semiconductor memory, (1) an analog switch is adopted as the logic gate stage for implementing an isolation function in the input buffer circuit thereby to substantially remove this logic gate stage, and (2) a plurality of logic gate stages are unified to reduce the total number of logic gate stages. These two measures will be explained below.

Figure 2A:
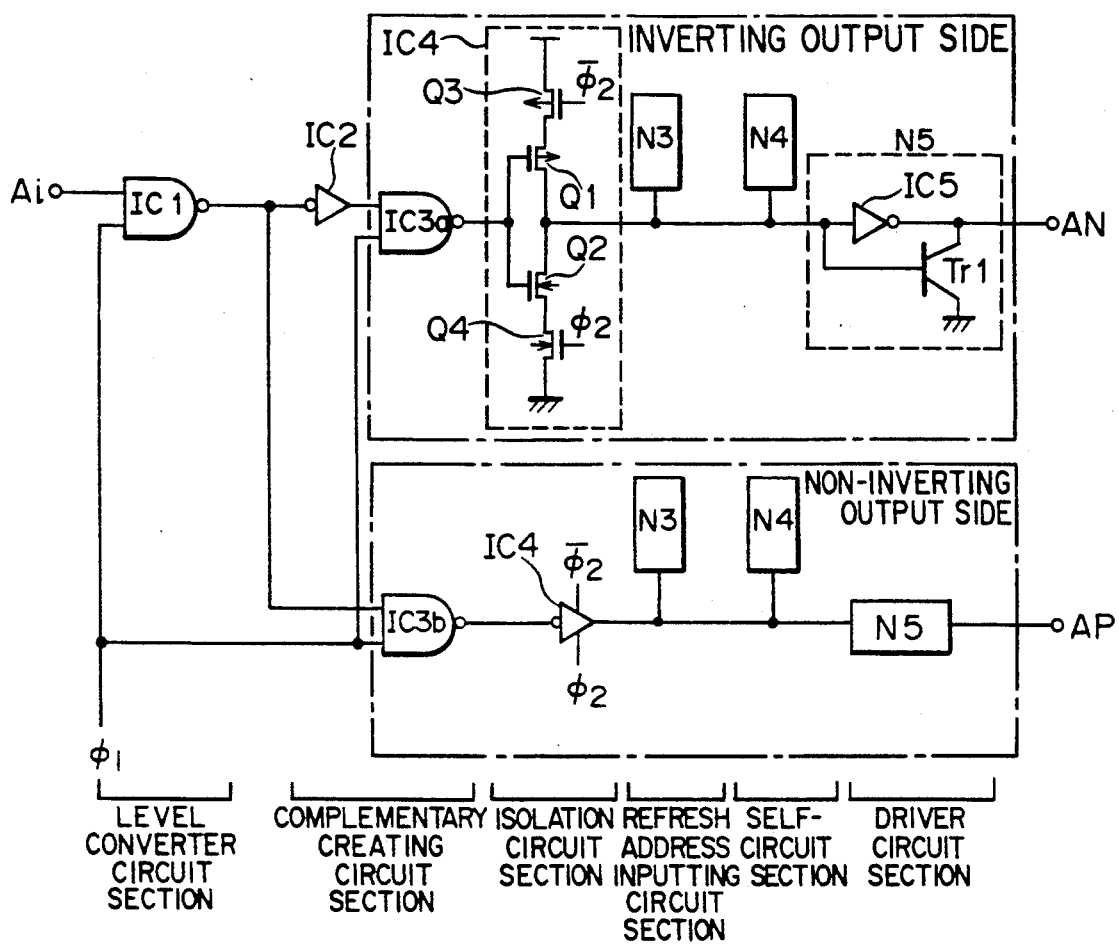
FIGS. 2A and 2B are a circuit diagram of the conventional input buffer and the corresponding operation waveform chart, respectively.
Figure 2B:
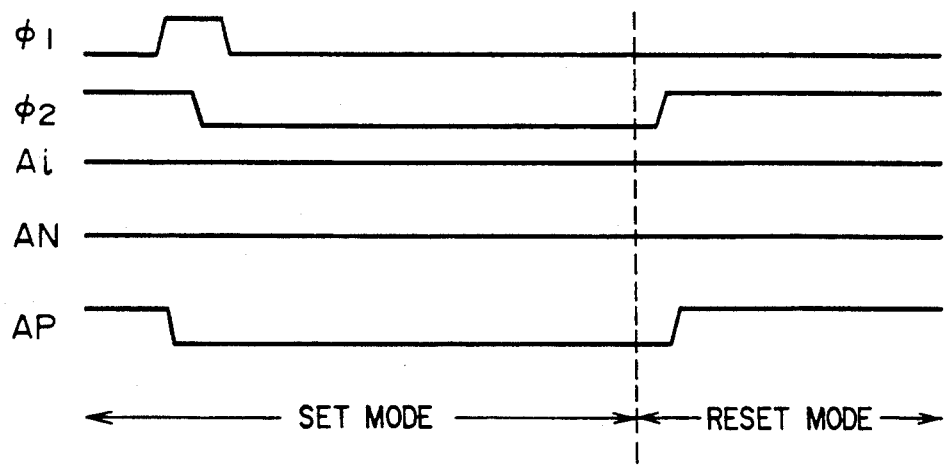
Figure 3:
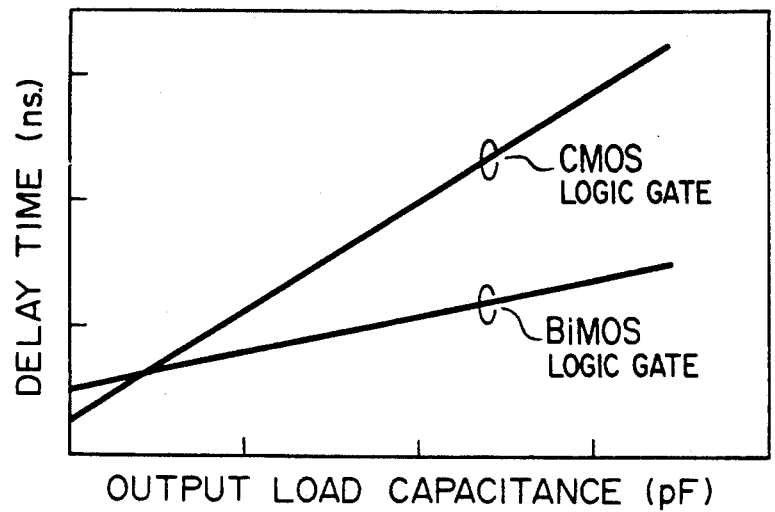
FIG. 3 is a graph showing the relationship between an output load capacitance and a delay time.
Figure 20A:
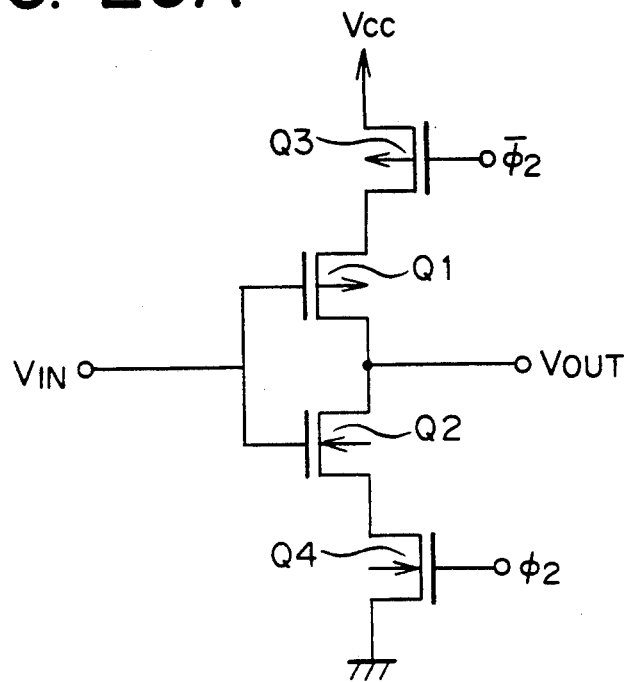
FIGS. 20a and 20B ar circuit diagrams of the conventional isolation circuit and the isolation circuit according to one embodiment of the present invention, respectively.
Figure 20B:
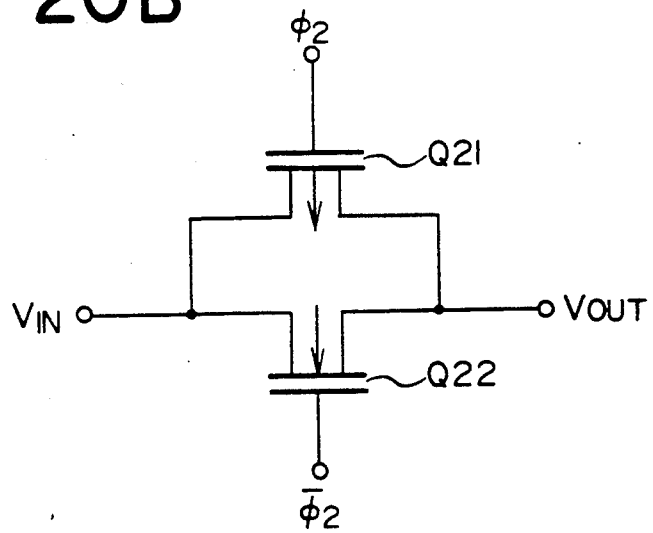

With respect to the above former measure (1), FIG. 20A shows the conventional isolation circuit which has been described in connection with FIGS. 2A and 2B, and FIG. 20B shows the isolation circuit according to the present invention which is designed as an analog switch in the transfer connection of a pMOS Q21 and an nMOS Q22. The analog switch having such a structure according to the present invention can enhance the signal propagation speed of the transfer gate since it is determined by the on-resistances of the MOS transistors. Thus, the logic gate stage of the isolation circuit section will be substantially canceled thereby to reduce one logic stage.

With respect to the above latter measure (2), of five logic stages on the inverting output side explained in connection with FIGS. 2A and 2B, the inverter IC2 at the second stage is indispensable to create a complementary output signal, the NAND gate IC3a is indispensable to switch over the set/reset mode, and the inverter IC5 at the fifth stage is indispensable to drive the bipolar transistor at the output stage. However, the respective logic gate stages may be commonly used so that if a single logic gate stage is given the signal inverting function, the switching function and the driver function, three logic gate stages can be unified into the single logic gate stage. For this reason, in accordance with the present invention, the signal inverting function and the switching function are added to the driver circuit at the final stage thereby to remove the signal inverting logic stage IC2 and the switching logic gate stage IC3a which are attendant on the conventional input buffer circuit.

Unifying the logic gate stages will be explained below.

Figure 19:
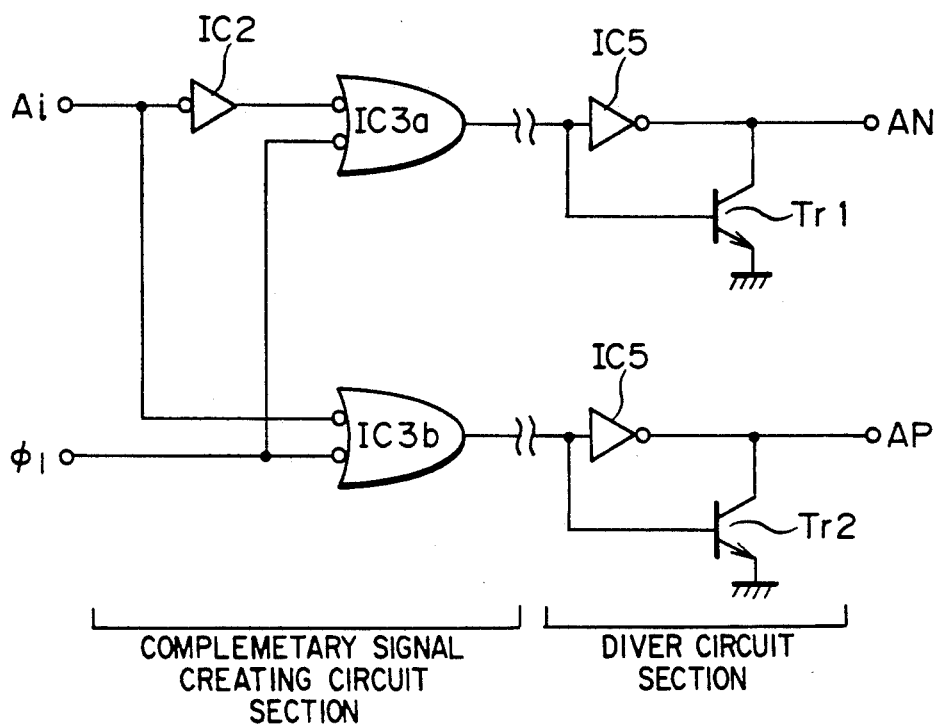
FIG. 19 is a diagram of the main part of the conventional input buffer.

FIG. 19 shows the complementary signal creating circuit section and the driver circuit selected from the components of the conventional structure to explain the unification of logic gate stages; the isolation circuit section IC4, the refresh address input circuit section N3 and the self-latch circuit N4 are not shown.

As explained previously in connection with the prior art, in the reset mode, the control signal $\phi 1$ is at the 'L' level so that both IC3a and IC3b become the 'H' level Thereafter, if they become 'L' level via the isolation circuit section IC4 (FIG. 2A), both bipolar transistors Tr1 and Tr2 turn off so that the both outputs AN and AP become the 'H' level. On the other hand, in the set mode, the control signal $\phi 1$ is at the 'H' level so that IC3a and IC3b are placed in their enabled state. Thus, the outputs AN and AP produce complementary signals according to the address signal Ai.

In the case where, in the input buffer for a DRAM, in the reset mode, both complementary signals are fixed to the 'H' level, in the set mode, the potential at one of the outputs fixed to the 'H' level in the reset mode has only to be fixed to the 'L' level. Therefore, only the transition or shift from the 'H' level to the 'L' level influences the operation speed. In other words, the transition from the 'L' level to the 'H' level does not influence the operation speed. Therefore, in accordance with the present invention, attention is paid to only the transition from the 'H' level to the 'L' level to improve the operation speed at this time.

Figure 22A:
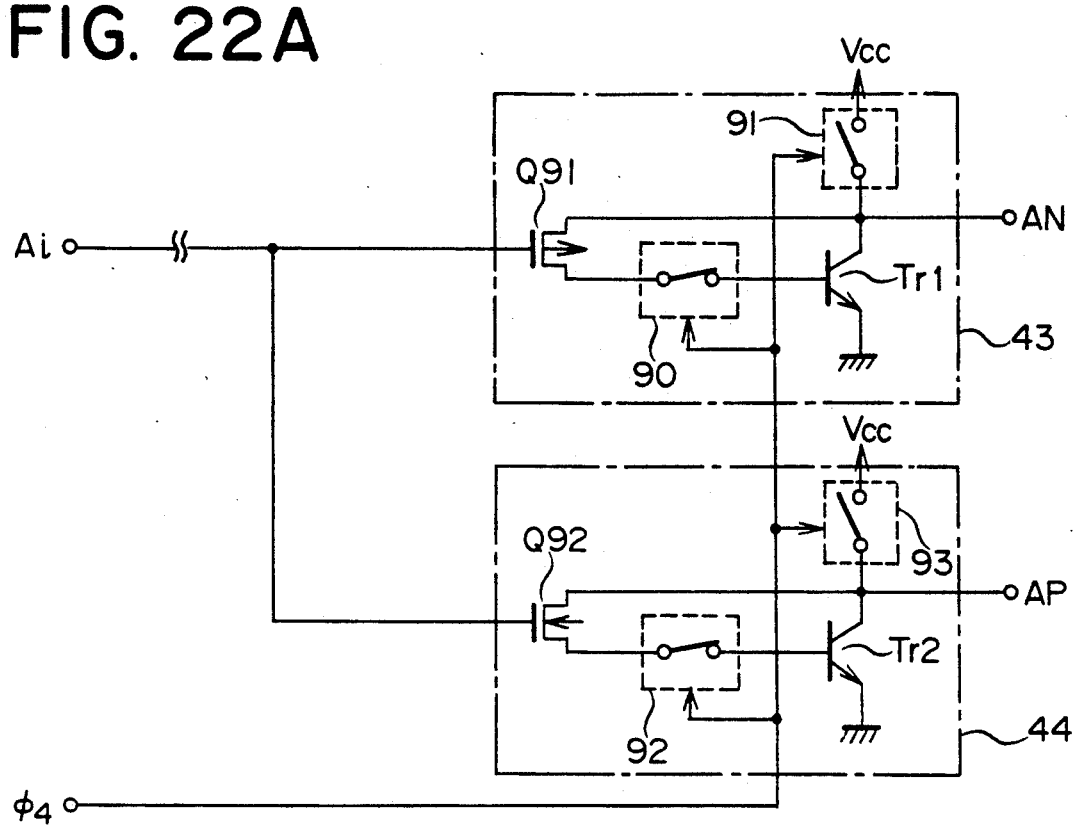
Figure 22B:
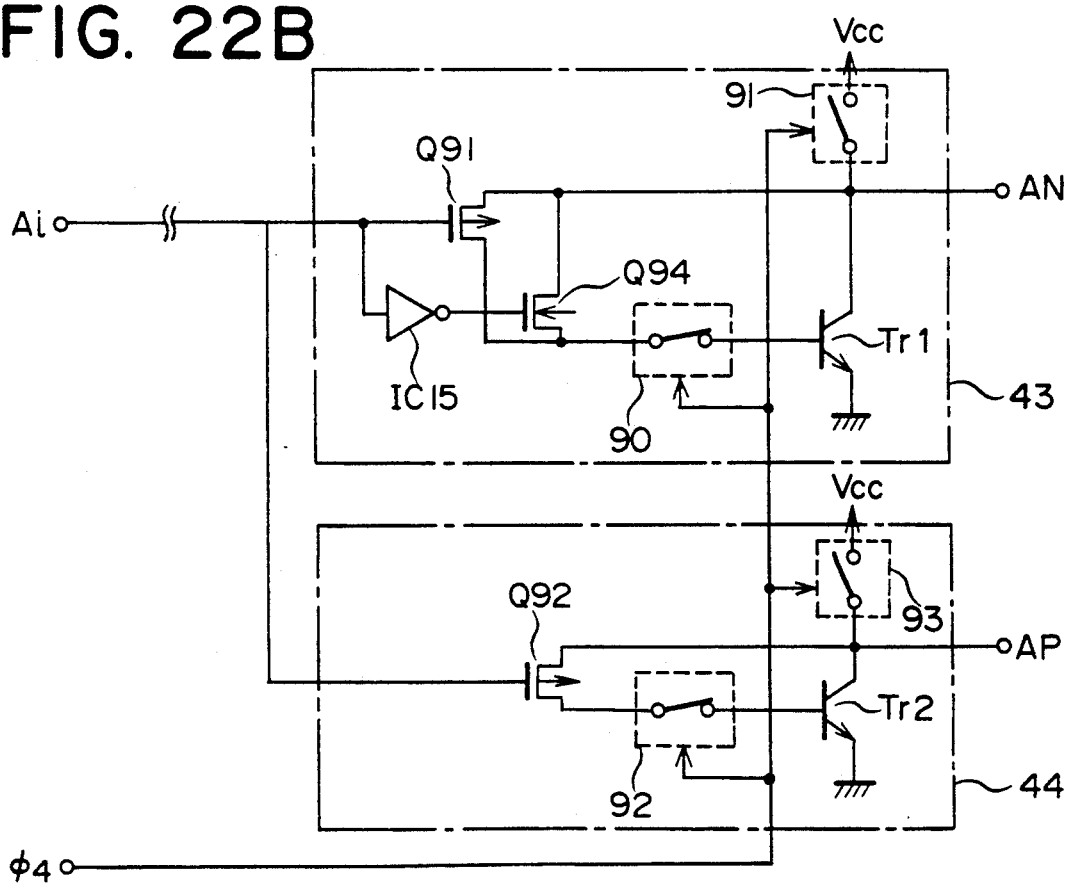

FIGS. 22A and 22B show the arrangements according to the present invention for performing the processing equivalent to that base on the arrangement shown in FIG. 19, respectively; each of those arrangements is composed of a non-inverted signal outputting unit 43 and an inverted signal outputting unit 44.

As shown in FIG. 22A, in the non-inverted signal outputting unit 43, a pMOS Q91 is connected through a switch 90 between the collector and the base of a bipolar transistor TR1 with the emitter grounded. The address signal Ai is inputted to the respective gates of pMOS's Q91 and Q92. The collector of Tr1 is connected with a power potential Vcc through the switch 91 and the collector potential of Tr1 is the output AN. Likewise, in the inverted signal outputting unit 44, an nMOS Q92 is connected through a switch 92 between the collector and the base of a bipolar transistor Tr2 with the emitter grounded. The collector of Tr2 is connected with a power potential Vcc through the switch 93 and the collector potential of Tr2 is the output AP.

In such an arrangement, in the reset mode, a control signal $\phi 4$ closes the switches 91 and 93 and opens the switches 90 and 92. Thus, irrespective of the address signal Ai, both Tr1 and Tr2 turn off and both outputs AN and AP become 'H' level On the other hand, in the set mode, the control signal $\phi 4$ opens the switches 91 and 93 and closes the switches 90 and 92. Then, with the address signal Ai at the 'H' level, Q91 is in an off state so that the output AN is held at the 'H' level, whereas Q92 is an on state so that the output AP shifts to the 'L' level Likewise, with the address signal Ai at the 'L' level Q91 is in the on state so that the output AN shifts to the 'L' level whereas Q92 is in the off state so that the output AP is held at the 'H' level.

The arrangement described permits the conventional three logic gate stages to be replaced by a single logic gate stage so that the number of logic gate stages in the input buffer circuit can be reduced from 5 in the prior art to 3, and also the number is made equal on both inverting output and non-inverting output sides.

Figure 5:
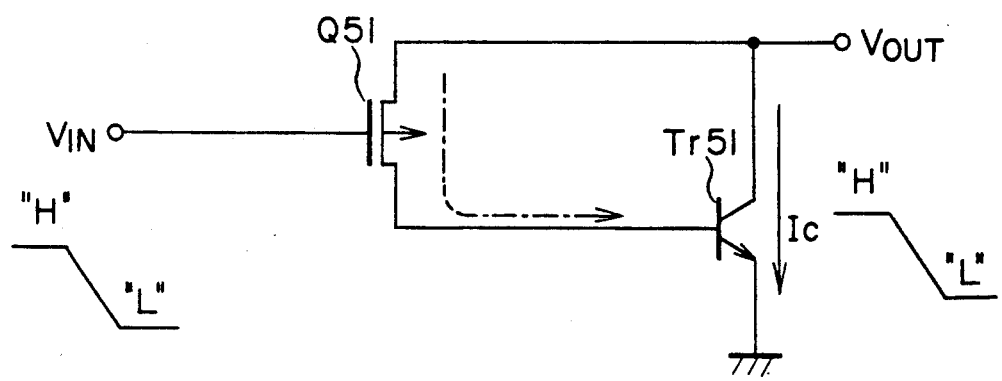
FIG. 5 is a circuit diagram of the basic arrangement of the conventional non-inverting buffer.

However, this provides a new problem to be solved. Specifically, the above non-inverted signal outputting section 43 is equivalent to the non-inverting buffer shown as the prior art in FIG. 5. Therefore, if in the set mode, Q91 is placed in the on state to inject the base current to Tr1, as described previously, reduction in the potential at the output AN leads to reduction the capability of supplying the base current, thus lowering the operation speed. As a result, although the number of logic gate stages in the above arrangement is equal on both the inverting and non-inverting sides, it cannot completely cancel the difference between the delay times of both outputs.

Such an inconvenience can be obviated by the following arrangement to the present invention. In order to insure that a sufficient amount of base current is supplied even when the collector potential decreases, as shown in FIG. 22B, the non-inverting buffer 43 successively supplies the base current through pMOS Q91 having a high current supplying capability when the gate potential and the source potential are in the neighborhood of the power supply potential and nMOS Q94 when the gate potential and the source potential are in the neighborhood of ground potential so that when the current supplying capability of pMOS Q91 is reduced owing to reduction of the collector potential, nMOS Q94 mainly supplies the base current.

Figure 4:
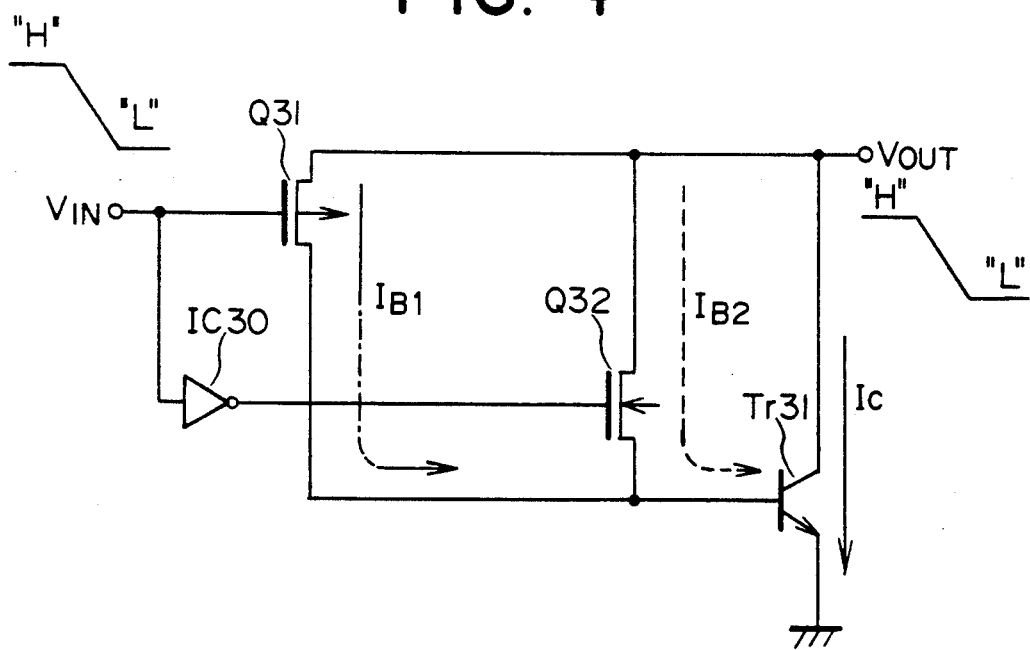
FIG. 4 is a circuit diagram of the basic arrangement of the non-inverting buffer according to the present invention.

FIG. 4 shows the arrangement for explaining the basic idea of the non-inverting buffer in which the base current is supplied to Tr31 through pMOS Q31 and nMOS Q32.

Figure 7:
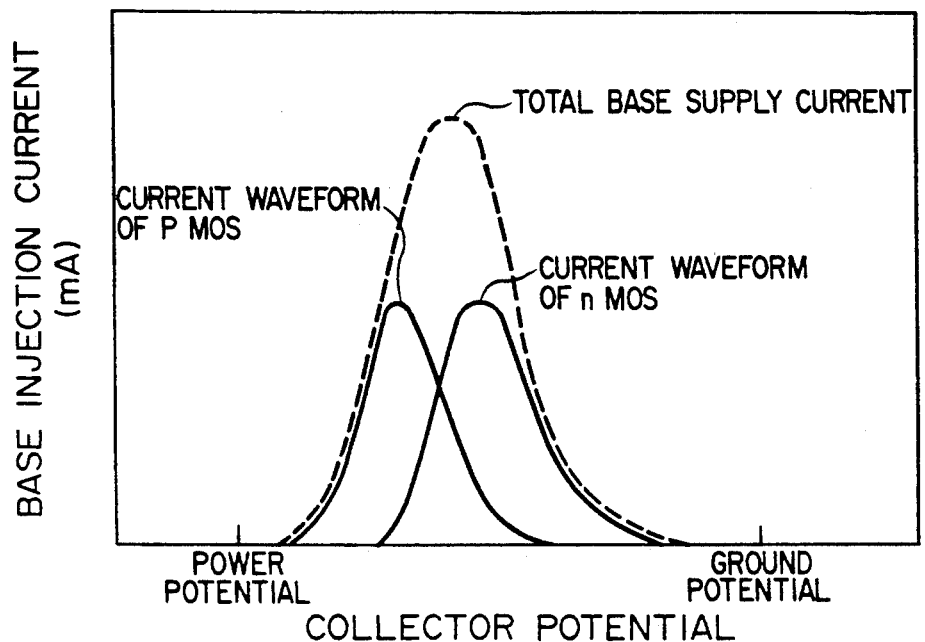
FIG. 7 is a graph for explaining the function of the non-inverting buffer according to the present invention.
Figure 8:
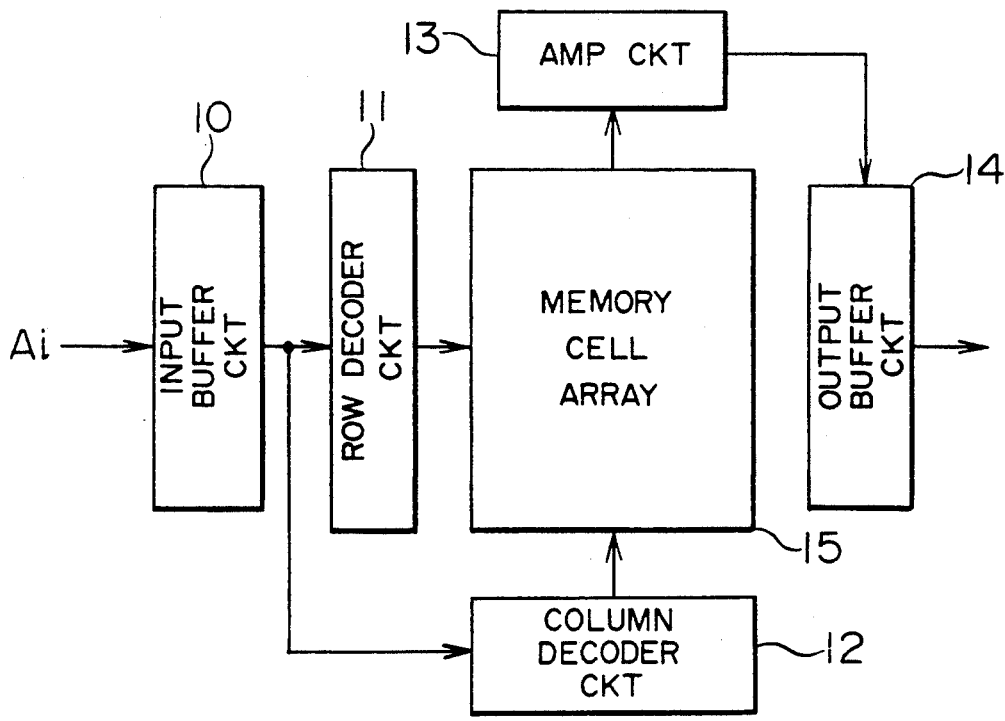
FIG. 8 is a block diagram of a semiconductor memory to which the present invention is applied.
Figures 9A, 9B, 9C:
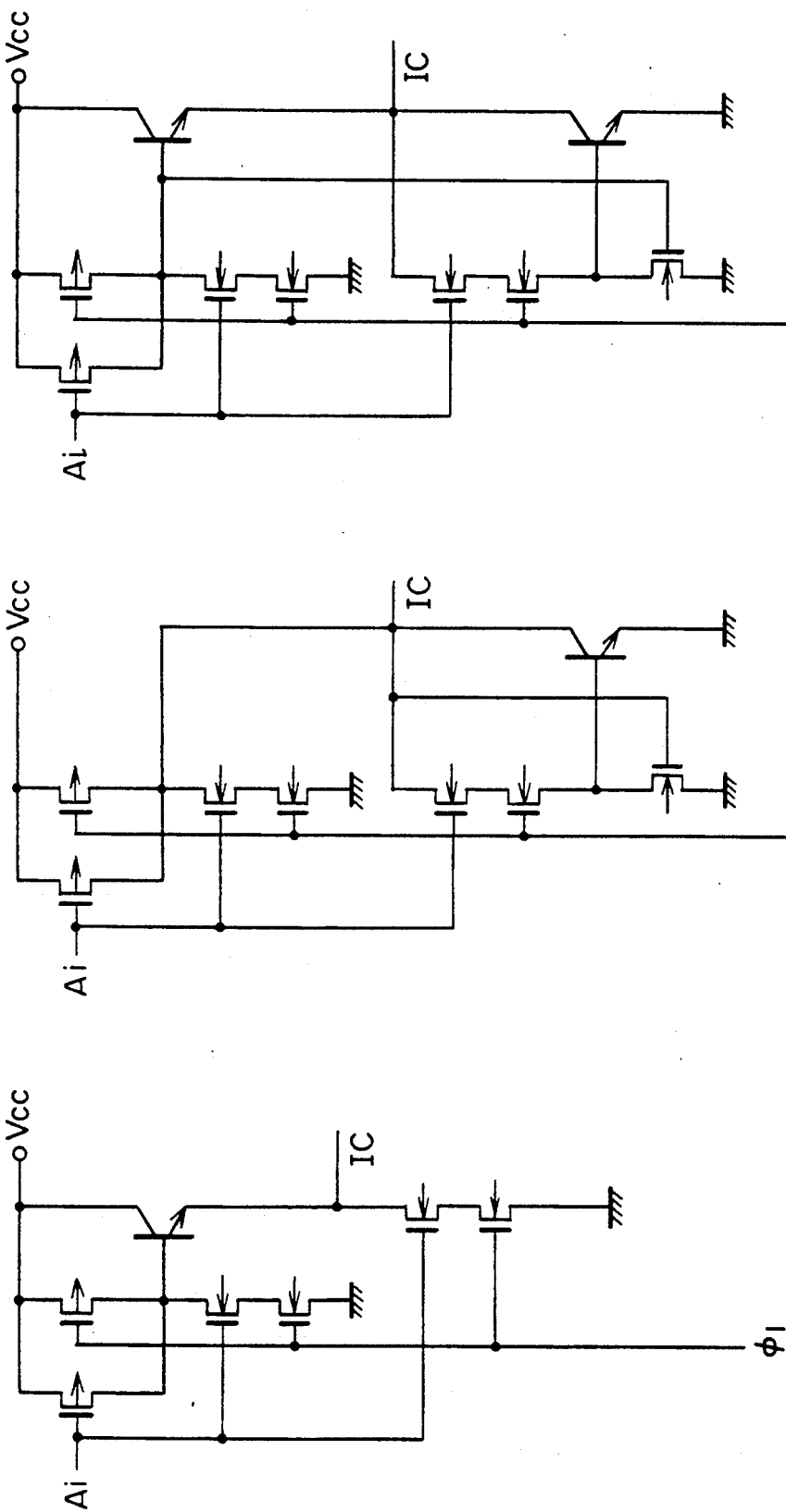
FIGS. 9A-9C, 10, 11, 12 and 13 are circuit diagram of other embodiments of the input buffer of the present invention, respectively.

In FIG. 4, if an input potential $V_{IN}$ shifts from the 'H' level to the 'L' level, as shown in FIG. 7, with the collector potential in the neighborhood of the power supply potential at beginning of the shift, pMOS Q31 turns on so that the base current $I_{B1}$ is supplied to the bipolar transistor Tr31; thus the collector current Ic flows to lower the output potential $V_{OUT}$.

As the output potential $V_{OUT}$ lowers, the gate-source voltage of pMOS Q31 lowers to reduce the current supplying capability. Then, the output potential of the inverter IC30 has been boosted so that nMOS Q32 turns on so that nMOS Q32 in place of pMOS Q31 supplies the base current to the bipolar transistor Tr31.

In such an arrangement, as shown by a dotted line in FIG. 7, the total amount of base current to the bipolar transistor is the sum of the base current from pMOS Q31 and that from nMOS so that a sufficient amount of base current, thus realizing the input buffer circuit operable at a high speed.

Additionally, although an explanation has been given of the case where both complementary signals are fixed at the 'H' level, the technical idea described above can be applied to the contrary case where in the reset mode, both the complementary signal are fixed to the 'L' level and in the set mode, either one of the two outputs fixed to the 'L' level is boosted to the 'H' level, as described later in connection with FIG. 18.

FIG. 22B shows the structure in which the function, described in connection with FIG. 4, provided by an nMOS 94 and an inverter IC15 is added to the arrangement of FIG. 22A. Since the operation of this embodiment is apparent from the above explanation, it is not explained here.

The arrangement explained hitherto can reduce the total number of logic gate stages in the input buffer circuit to realize the high speed operation and also remove the difference in the delay time between the inverting output side and the non-inverting output side.

Figure 17:
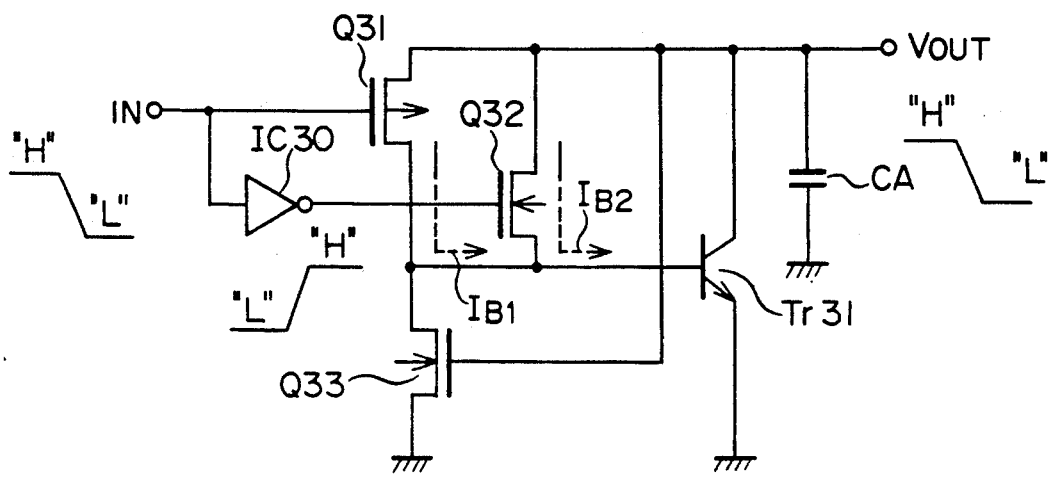
FIGS. 17 and 18 are circuit diagrams of the non-inverting buffer according to embodiments of the present invention, respectively.

Now referring to FIG. 17, one embodiment of the present invention will be explained below. FIG. 17 shows the non-inverting buffer circuit according to one embodiment of the present invention. In FIG. 17, like reference symbols designate like elements in FIG. 4.

The non-inverting buffer according to this embodiment is composed of a pMOS Q31, nMOS's Q32 and Q33, an npn bipolar transistor Tr31, and an inverter IC30. The sources of pMOS Q31 and nMOS Q32, the collector of the bipolar transistor Tr31, the gate nMOS Q33 are connected with the output potential $V_{OUT}$; the drains of Q31 and Q32 and the source of Q33 are connected with the base of Tr31; and the drain of Q33 and the emitter of Tr31 are connected with ground potential. Further, the gate of Q31 is connected with an input potential $V_{IN}$ and the gate of Q32 is connected with the input potential $V_{IN}$ through the IC30. Incidentally, CA schematically denotes a capacitor component such as the wiring capacitance of a circuit connected with a succeeding stage and a gate capacitance, and nMOS Q33 serves as an element for extracting the basic charge.

Figure 6:
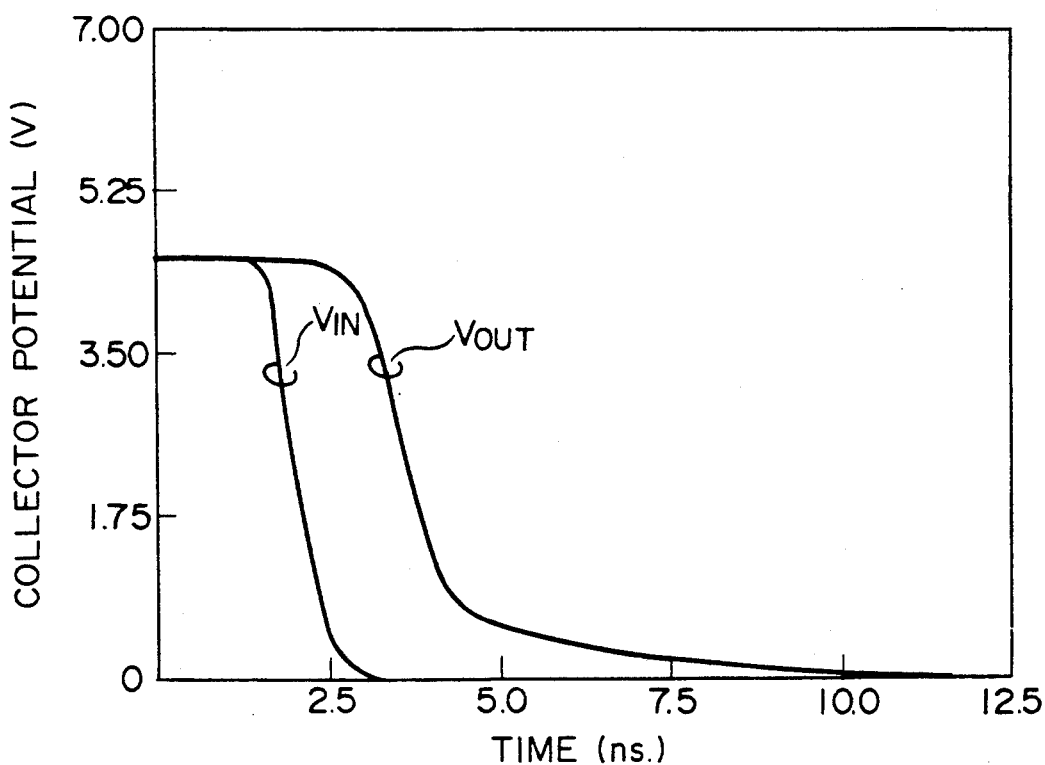
FIG. 6 is a graph showing the transient response characteristic of the conventional non-inverting buffer.

In FIG. 17, with both input potential $V_{IN}$ and output potential $V_{OUT}$ fixed to the 'H' level, if the input potential shifts to the 'L' level, pMOS Q31 turns on so that the base current $I_{B1}$ is supplied to the bipolar transistor Tr31, thus turning on Tr31. When Tr31 turns on, the charges stored in the capacitor CA are discharged as an emitter current through Tr31 so that the output potential $V_{OUT}$ starts to lower (FIG. 6). Lowering of the output potential decreases the gate-source voltage of Q31 so that the drain current of Q31 is decreased. If the output potential of IC30 is boosted as the input potential $V_{IN}$ lowers, Q32 turns on so that the base current $I_{B2}$ and the drain current from Q32 as well as the base current from Q31 are supplied to the base of the bipolar transistor Tr31. As a result, even when the output potential $V_{OUT}$ lowers to the neighborhood of the 'L' level, a sufficient amount of drain current is supplied to Tr31 so that the operation speed is not lowered.

Figure 18:
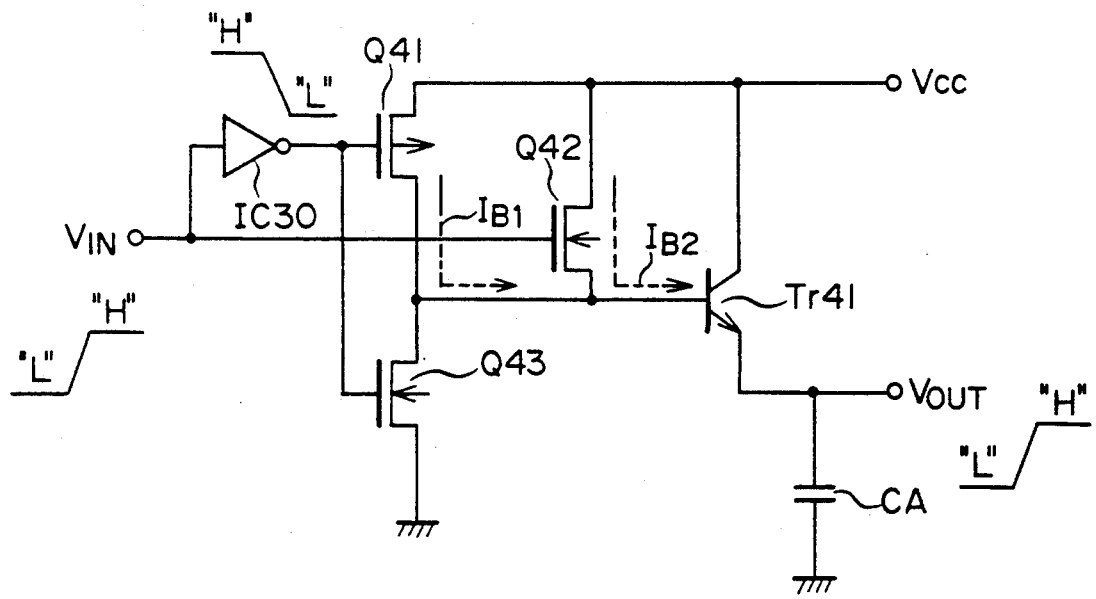

FIG. 18 shows the non-inverting buffer circuit for improving the operation speed when, with both input and output potentials fixed to the 'L' level in contrast to the case of FIG. 17, the input potential $V_{IN}$ shifts to the 'H' level. In FIG. 18, like reference symbols designate like elements in FIG. 17. The transition of the input potential $V_{IN}$ from its 'L' level to its 'H' level causes the emitter current from a bipolar transistor Tr41 to be charged in the capacitor CA. The operation in this embodiment, which is apparent to those skilled in the art from the explanation on FIG. 17, is not explained here.

Figure 21:
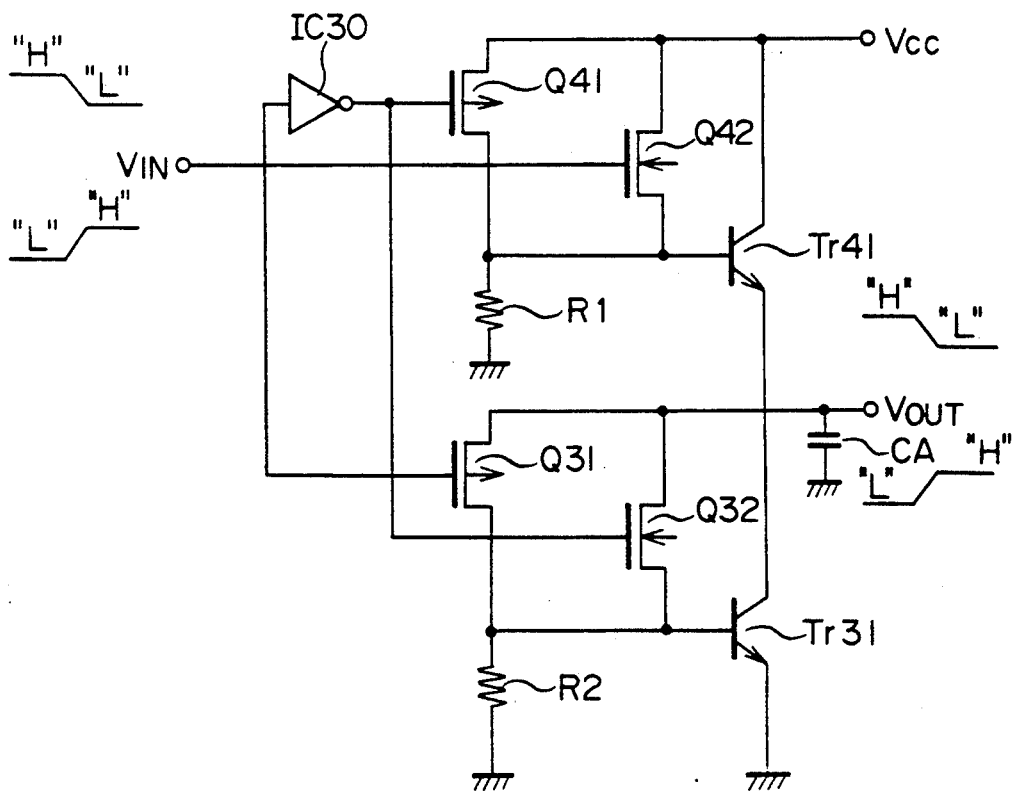
FIGS. 21, 22A and 22B are circuit diagrams showing the main part of the input buffer according to the present invention, respectively.

FIG. 21 shows the non-inverting buffer circuit operable at a high speed by combining the structure of FIG. 17 with that of FIG. 18 in both cases where the input potential $V_{IN}$ shifts from the 'L' level to the 'H' level and vice versa. In FIG. 21, like reference symbols designate like elements in FIGS. 17 and 18. Incidentally, it should be noted that resistors R1 and R2 are used to extract the base charges. The operation of this embodiment, which is apparent from the above explanation, is not explained here.

Figure 1A:
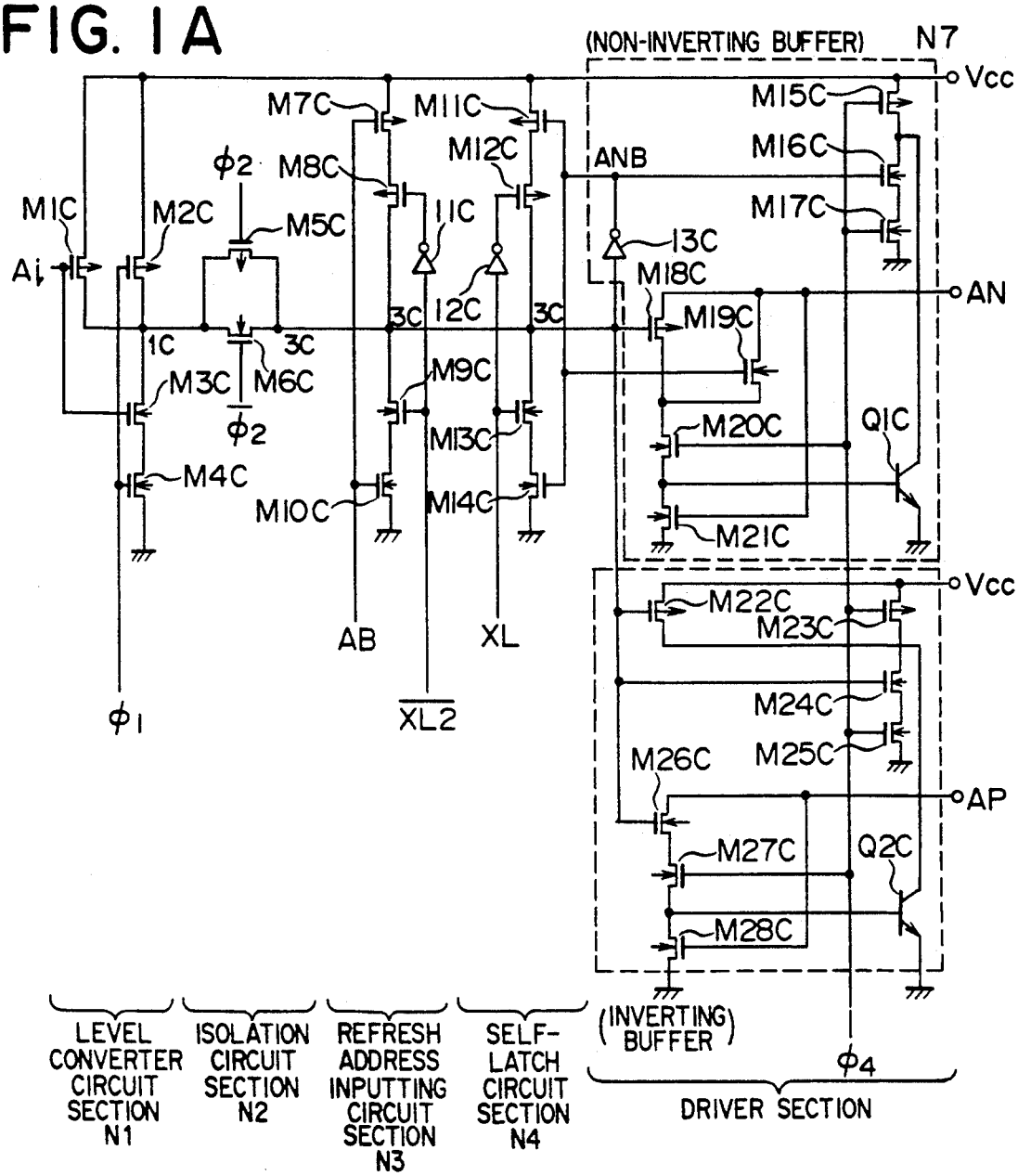
FIG. 1A is a circuit diagram of an input buffer showing one embodiment of the present invention.
Figure 1B:
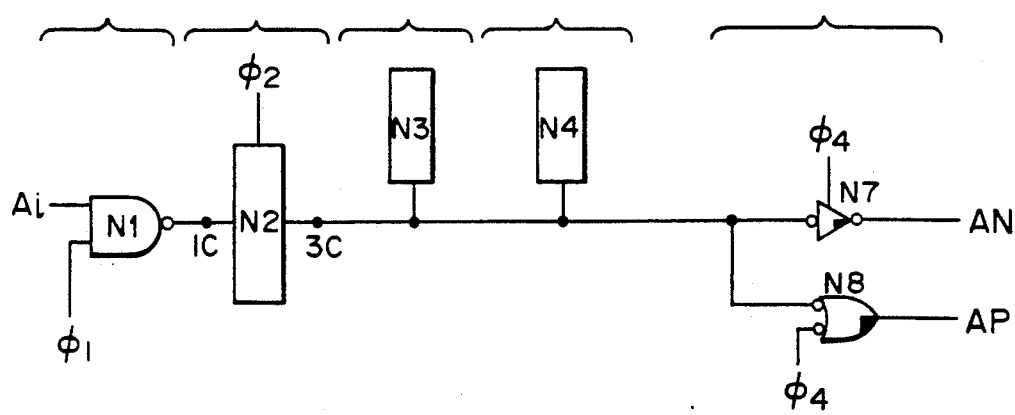
FIG. 1B is a schematic block diagram of the circuit of FIG. 1A.

FIGS. 1A and 1B show the input buffer circuit according to one embodiment in its circuit diagram and block form, respectively. FIG. 1C shows a timing chart of the waveforms at respective nodes including the input/output node and control signals. In FIG. 1C, a control signal AB and XL2 vary only during a refresh cycle and fixed during a normal reading cycle.

The input buffer circuit according to this embodiment is composed of five circuit sections of a level converter circuit section N1, an isolation circuit section N2, a refresh address inputting circuit section N3, a self-latch circuit section N4 and a driver circuit section. The driver circuit section comprises a non-inverting buffer circuit N7 and an inverting buffer circuit N8.

The level converter circuit N1 is a 2 input NAND gate receiving two input signals of an address signal Ai and a control signal $\phi 1$; this gate is composed of pMOS's M1C, M2C and nMOS's M3C, M4C. In operation, if the control signal $\phi 1$ inputted to the level converter circuit section N1 is at the 'L' level, its output is fixed to the 'H' level regardless of the value of the address signal Ai; on the other hand, if the control signal $\phi 1$ is at the 'H' level, the output is the inverted signal of the address signal. Incidentally, although the 2 input NAND gate in FIGS. 1A and 1B is composed of only MOS transistors, it may be designed by a composite circuit of MOS transistors and bipolar transistors.

The isolation circuit section N2 is a switching circuit in a transfer structure composed of a pMOS M5C and an nMOS M6C; the signal propagation from node 1c to node 3c is controlled using control signals $\phi 2$ and $\overline{\phi 2}$. The isolation circuit section N2 may be constructed by either one of pMOS M5C and nMOS M6C. In operation, if the control signal $\phi 2$ becomes 'L' level (the control signal $\overline{\phi 2}$ becomes the 'H' level), both MOS transistors MC5 and MC6 turn on so that the signal propagation from the node 1C to the 3C is permitted. In contrast, if the control signal $\overline{\phi 2}$ becomes 'H' level, both MOS transistors turn off to place the isolation circuit section in an isolated state so that the signal propagation from the node 1C to the node 3C is inhibited.

The refresh address inputting circuit N3 is composed of pMOS's M7C, M8C, nMOS's M9C, M10C and an inverter circuit 11C. In operation, if the control signal $\overline{XL2}$ becomes 'H' level so that M8C and M9C turn on, the refresh address inputting circuit N3 serves as an inverter. Therefore, if the above isolation circuit section N3 is in the isolated state, while the control signal $\overline{XL2}$ is at the 'H' level, the inverted signal of a refresh address signal AB is provided at the node 3C.

The self-latch circuit section N4 is a latch circuit for fixing the potential at the node 3C to the power potential or ground potential; this latch circuit is composed of pMOS's M11C, M12C and nMOS's M13C, M14C, and inverters 12C, 13C. In operation, if a control signal XL becomes 'H' level, pMOS M 2C and nMOS M13C turn on. Therefore, as in the above refresh address inputting circuit N3, the self-latch circuit section N4 serves as an inverter in terms of a node ANB. Thus, if the potential at the node 3C is in the neighborhood of 'H' level, the output (node ANB) is at the 'L' level. As a result, M11C turns on and M14C turns off so that the potential at the node 3C is boosted to the power potential. In contrast, if the potential at the node 3C is in the neighborhood of 'L' level, M11C turns off and M14C turns on so that the potential at the node 3C becomes the ground potential.

The non-inverting buffer N7 is composed of pMOS's M15C, M18, nMOS's M16C, M17C, M19C to M21C, and an npn bipolar transistor Q1C. If a control signal $\phi 4$ is at the 'L' level, this non-inverting buffer N7 produces the output AN forcibly boosted to the 'H' level regardless of the input signal (node 3C), and if the control signal $\phi 4$ is at the 'H' level, it produces the signal at the level according to the input signal.

Figure 1D:
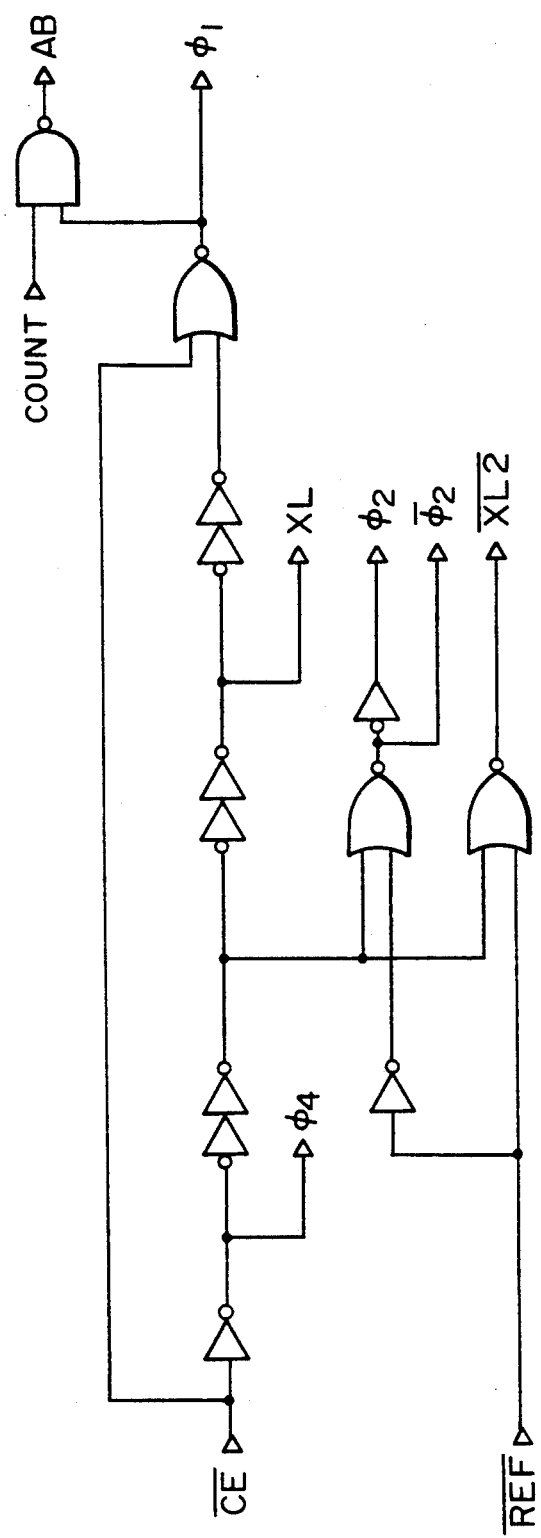
FIG. 1D is a diagram showing one example of the circuit for generating several kinds of control signals used in the circuit of FIG. 1A.

FIG. 1D shows an example of the circuit for generating control signals. In FIG. 1D, input signals include the respective inverted signals CE and Ref of a chip enable signal for a semiconductor memory circuit and a refresh cycle starting signal and a semiconductor counter signal Count. The signal Ref is at the 'H' level during a read cycle, and the signal Count which is sent from a counter incorporated in the semiconductor chip changes only during a refresh cycle and is fixed to the 'H' or 'L' level during the read cycle. In the circuit operation, the waveforms of the signals $\phi 1$, $\phi 2$, $\overline{\phi 2}$, $\phi 4$ and XL are determined by the signal CE. Specifically, if the signal CE is at the 'L' level, they exhibit the waveforms in the set mode as shown in the timing chart of FIG. 1C, and if the signal CE is at the 'H' level, they exhibit the waveforms in the reset mode.

In the non-inverting buffer N7, M18C, M19C, Q1C and the inverter 13C are designed in a double injection structure explained in connection with FIGS. 4 and 17.

The non-inverting buffer N7 structured as mentioned above operates as follows. If the control signal $\phi 4$ becomes the 'L' level, M20C turns off so that even if M18C and M19C turn on owing to the input signal, no current is supplied to the base of the bipolar transistor Q1C and so Q1C remains off. Then, M15C turns on and M17C turns off so that the drain current of M15C is supplied to the output AN; thus, the potential at the output AN is forcibly boosted to the 'H' level. On the other hand, if the control signal $\phi 4$ becomes 'H' level, M20C turns on so that a current is supplied to the base of Q1C. Then, M15C turns off so that the drain current therefrom is not supplied to the output. In such a state, if the node 3C is at the 'H' level, both M18C and M19C are in the off state; therefore, Q1C does not operate and so the output AN holds is initial state. If the node 3C becomes 'L' level, both M18C and M19C turn on (strictly speaking, they turn on in the order of M18C and M19C). Therefore, even when the collector potential of Q1C lowers, current is supplied to the base of Q1C according to the theory described above. Thus, without reducing the driving capability of Q1C, the potential of the output AN is placed in the 'L' level.

Figure 10:
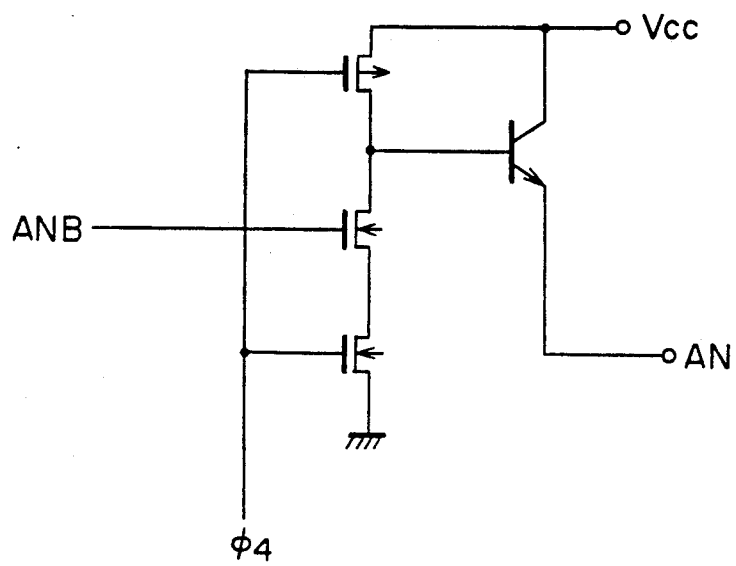
Figure 11:
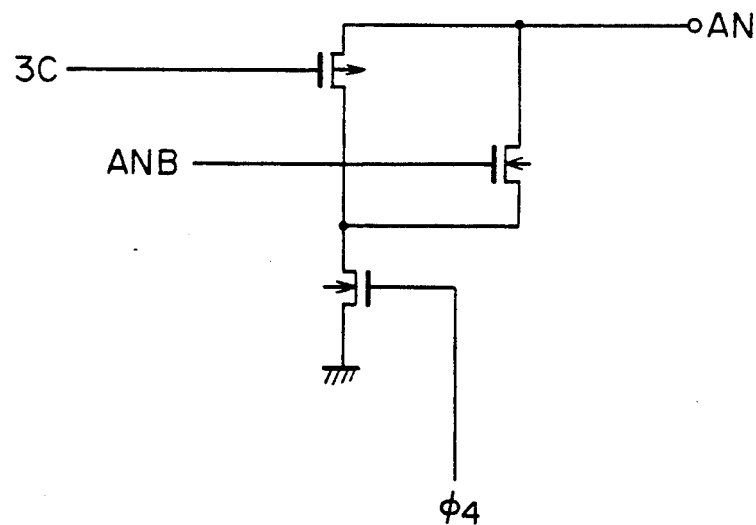

Additionally, although in this embodiment, the circuit section required to boost the potential at the output AN has been explained as being composed of MOS transistors M15C to M17C, it may be designed by a composite circuit of MOS transistors and a bipolar transistor as shown in FIG. 10. Also, the circuit section required to lower the potential at the output AN may be composed of only MOS transistors as shown in FIG. 11.

Figure 12:
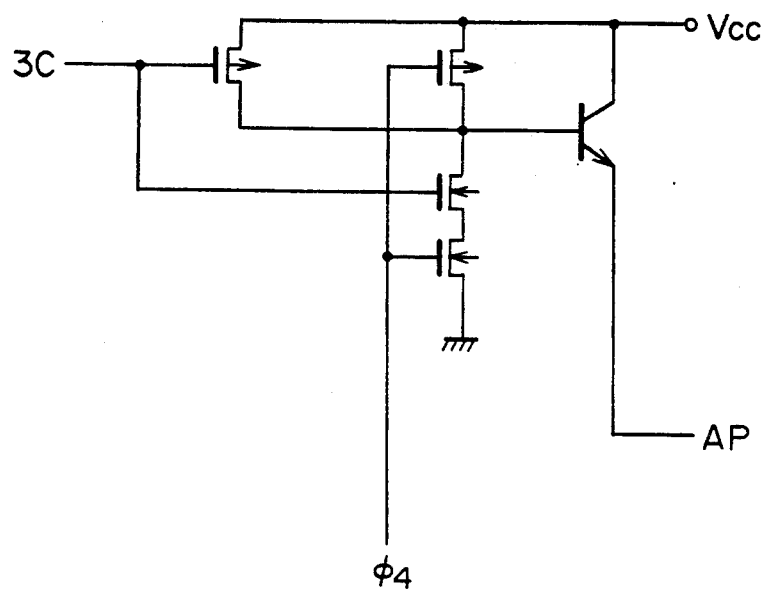
Figure 13:
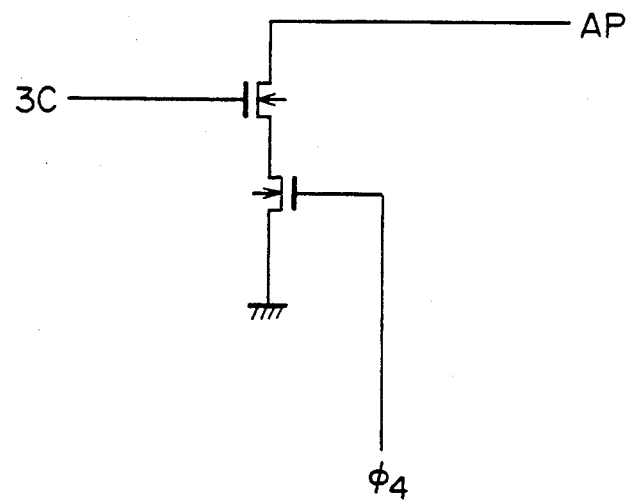

The inverting buffer N8, as seen from the figure, is a 2 NAND circuit designed in a composite structure of MOS transistors and a bipolar transistor which is used only as the element reducing the output potential. Its operating theory is apparent to those skilled in the art. Although the circuit section required to boost the potential at the output AP is composed of only MOS transistors M22C to M25C, it may be designed by a composite circuit of MOS transistors and a bipolar transistor (FIG. 12). The circuit section required to lower the potential at the output AP may be composed of only MOS transistors as shown in FIG. 13.

In accordance with this embodiment, a plurality of logic gate stages are unified to reduce the total number of logic gate stages and also the isolation circuit is composed of MOS transistors in the transfer structure. Therefore, the number of logic gate stages which was 5 in the prior art can be reduced to 2 stages consisting of the level converter circuit section and the driver circuit section, thus greatly enhancing the operation speed of a semiconductor memory. Further, the base current to the bipolar transistor provided at the final stage of the non-inverting buffer circuit constituting the driver circuit is supplied through the pMOS and nMOS which are controlled by the inverted signal and non-inverted signal of a common signal, respectively so that the operation speed of the non-inverting buffer is improved, thus canceling a difference in the delay times of complementary signals.

Figure 14:
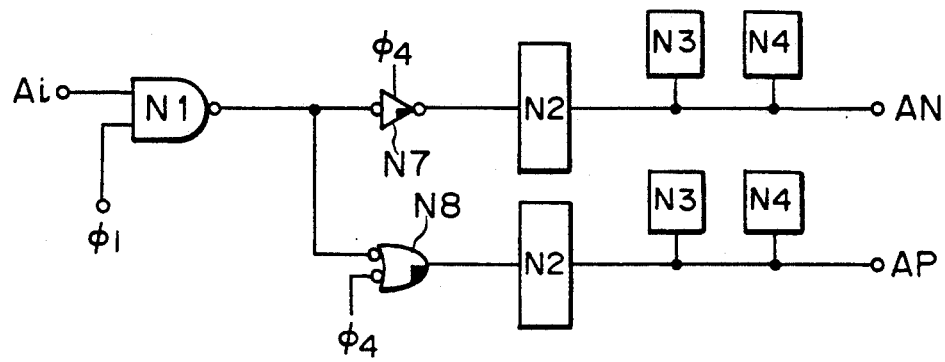
FIGS. 14, 15 and 16 are block diagrams of further embodiments of the input buffer according to the present invention, respectively.
Figure 15:
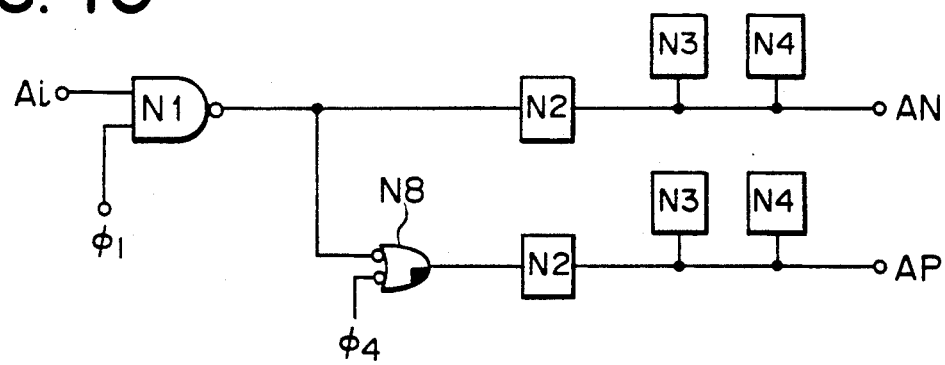
Figure 16:
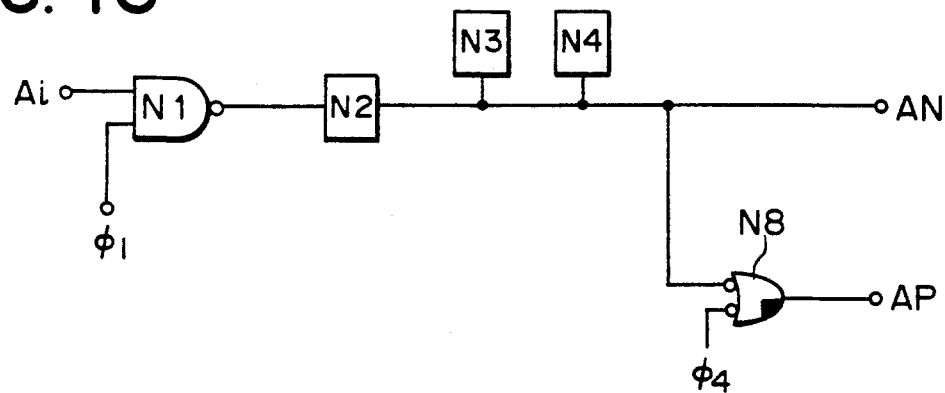

FIGS. 14 and 16 show other embodiments of the present invention in which like reference symbols designate like elements in the figure previously explained. In the embodiment shown in FIG. 14, the non-inverting buffer N7 and the inverting buffer N8 arranged at the stage subsequent to the level converter section. In the embodiment shown in FIG. 15, the non-inverting buffer N7 is removed from the arrangement of FIG. 14. Although this embodiment cannot solve the problem attendant on the difference in the delay time on the sides of the inverting output and the non-inverting output, it can reduce the number of logic gate stages greatly as in the respective embodiments hitherto explained, thereby providing DRAM operable at a high speed. Further, the embodiment shown in FIG. 16 in which the non-inverting buffer N7 is removed from the arrangement of FIG. 1 can also have the same advantage as that of FIG. 15.

Incidentally, although the respective embodiments have been explained in the form of applying the present invention to a DRAM, the present invention can be applied to an SRAM as long as the refresh address inputting circuit is ignored.

As understood the explanation hitherto made, in accordance with the present invention, the following advantages can be obtained. Since a plurality of logic gate stages included in the input buffer circuit constituting a semiconductor memory are unified to reduce the total number of logic gate stages, the operation speed of the semiconductor memory can be enhanced. Since the isolation circuit in the input buffer circuit is composed of MOS transistors in a transfer structure, the total number of logic gate stages can be further reduced, thereby further improving the operation speed of the semiconductor memory. In addition, the base current to the bipolar transistor provided at the final stage of the non-inverting buffer circuit is successively supplied through a pMOS and an nMOS, the operation speed of the non-inverting buffer circuit can be increased.

We claim:

1. A non-inverting buffer circuit device in which at least a MOS transistor at an input stage drives a bipolar transistor to produce an output, comprising:

signal inverting means for producing an inverted signal of an input digital signal;

a bipolar transistor having an emitter grounded, a base and a collector;

an n-channel MOS transistor connected in parallel between the base and the collector of said bipolar transistor, said n-channel MOS transistor being on-off controlled by said inverted signal; and a p-channel MOS transistor connected in parallel between the base and the collector of said bipolar transistor, said p-channel MOS transistor being on-off controlled by the non-inverted signal of the input digital signal, thereby providing the collector potential of said bipolar transistor as an output digital signal of said device.

2. A non-inverting buffer circuit device in which at least a MOS transistor at an input stage drives a bipolar transistor to produce an output, comprising:

signal inverting means for producing an inverted signal of an input digital signal;

a bipolar transistor with the collector connected with a power supply a p-channel MOS transistor connected in parallel between the base and the collector of said bipolar transistor, said p-channel MOS transistor being on-off controlled by said inverted signal; and an n-channel MOS transistor connected in parallel between the base and the collector of said bipolar transistor, said n-channel MOS transistor being on-off controlled by the non-inverted signal of the input digital signal, thereby providing the emitter potential of said bipolar transistor as an output digital signal of the device.

3. A non-inverting buffer circuit device in which at least a MOS transistor at an input stage drives a bipolar transistor to produce an output, comprising:

signal inverting means for producing an inverted signal of an input digital signal;

a first bipolar transistor emitter-grounded;

a second bipolar transistor with the collector connected with a power supply and the emitter connected with the collector of said first bipolar transistor;

a first n-channel MOS transistor connected in parallel between the base and the collector of said first bipolar transistor, said first n-channel MOS transistor being on-off controlled by said inverted signal;

a first p-channel MOS transistor connected in parallel between the base and the collector of said first bipolar transistor, said first p-channel MOS transistor being on-off controlled by the non-inverted signal of the input digital signal, a second n-channel MOS transistor connected in parallel between the base and the collector of said second bipolar transistor, said second n-channel MOS transistor being on-off controlled by said non-inverted signal;

a second p-channel MOS transistor connected in parallel between the base and the collector of said second bipolar transistor, said second p-channel MOS transistor being on-off controlled by the inverted signal of the input digital signal, thereby providing the collector potential of said first bipolar transistor as an output digital signal of the device.

4. A semiconductor memory circuit device provided with an input buffer circuit comprising:

gate means for controlling an address input signal supplied from an external terminal in accordance with a first control signal and holding its output at a first prescribed potential during an input inhibiting period;

inverted signal outputting means connected with a stage subsequent to said gate means and having a set mode and a reset mode determined in accordance with a second control signal, for outputting in the set mode, an inverted signal of the input signal and outputting in the reset mode, a signal held at a second prescribed potential; and non-inverted signal outputting means connected in parallel with said inverted signal outputting means and having a set mode and a reset mode determined in accordance with said second control signal, for outputting in the set mode, a non-inverted signal of the input signal and outputting in the reset mode, a signal held at said second prescribed potential, thereby providing the respective output signals from said inverted signal outputting means and said non-inverted signal outputting means in the form of complementary signals.

5. A semiconductor memory circuit device provided with an input buffer circuit comprising:

gate means for controlling an address input signal supplied from an external terminal in accordance with a first control signal and holding its output at a prescribed potential during an input inhibiting period;

isolation means for controlling propagation of the output from said gate means to a succeeding stage;

latch means for latching an output signal from said isolation means; and inverted signal outputting means having a set mode and a reset mode determined in accordance with a second control signal such that in the set mode, it outputs an inverted signal of the output signal from said latch means while in the reset mode, it holds the output at the same potential as the output from said latch means; whereby the respective output signals from said latch means and said inverted signal outputting means are outputted as complementary signals, said inverted signal outputting means comprising:

an emitter-grounded bipolar transistor for producing an output signal at its collector potential;

first switching means coupled to said bipolar transistor for controlling the supply of a collector current to said bipolar transistor;

an n-channel MOS transistor connected in parallel between the base and the collector of said bipolar transistor, said n-channel MOS transistor for supplying a base current to said bipolar transistor in accordance with the non-inverted signal of an input digital signal;

second switching means coupled to said bipolar transistor for controlling the supply of said base current to said bipolar transistor;

said first and said second switching means being selectively on-off controlled in accordance with second control signal.

6. A semiconductor memory circuit device provided with an input buffer circuit comprising:

gate means for controlling an address input signal supplied from an external terminal in accordance with a first control signal and holding its output at a first prescribed potential during an input inhibiting period;

isolation means for controlling propagation of the output from said gate means to a succeeding stage;

latch means for latching the output signal from said isolation means; and inverted signal outputting means having a set mode and a reset mode determined in accordance with a second control signal in such a manner that in the set mode, it outputs an inverted signal of the output signal from said latch means while in the reset mode, it holds the output at a second prescribed potential;

non-inverted signal outputting means having a set mode and a reset mode determined in accordance with said second control signal in such a manner that in the set mode, it outputs the non-inverted signal of the output signal from said latch means while in the reset mode, it holds the output at said second prescribed potential; whereby the respective output signals from said inverted signal outputting means and said non-inverted signal outputting means are outputted as complementary signals, said inverted signal outputting means comprising:

a first emitter-grounded bipolar transistor for producing an output signal at its collector potential;

first switching means coupled to said first bipolar transistor for controlling the supply of a collector current to said first bipolar transistor;

a first n-channel MOS transistor connected in parallel between the base and the collector of said first bipolar transistor, said first n-channel MOS transistor for supplying a base current to said first bipolar transistor in accordance with the non-inverted signal of an input digital signal;

second switching means coupled to said first bipolar transistor for controlling the supply of said base current to said first bipolar transistor;

said non-inverted signal outputting means comprising:

a second emitter-grounded bipolar transistor for producing an output signal at its collector potential;

third switching means coupled to said second emitter-grounded bipolar transistor for controlling the supply of a collector current to said second bipolar transistor;

signal inverting means for producing the inverted signal of an input signal;

a second n-channel MOS transistor connected in parallel between the base and the collector of second bipolar transistor, said second n-channel MOS transistor for supplying a base current to said second bipolar transistor in accordance with said inverted signal;

a first p-channel MOS transistor connected in parallel between the base and the collection of said second bipolar transistor, said p-channel MOS transistor for supplying a base current to said second bipolar transistor in accordance with the non-inverted signal of an input digital signal;

fourth switching means coupled to said second bipolar transistor for controlling the supply of said base current to said second bipolar transistor;

said first and said third switching means, and said second and said fourth switching means being selectively on-off controlled in accordance with said second control signal.

7. A swmiconductor memory circuit device according to claim 5 further comprising refresh address signal inputting means coupled between said isolation means and said latch means for periodically renewing information stored in memory cells of said memory circuit during a refresh mode period.

8. A semiconductor memory circuit device provided with an input buffer circuit comprising:

gate means for controlling an address input signal supplied from an external terminal in accordance with a first control signal and holding its output at a prescribed potential during an input inhibiting period; inverted signal outputting means having a set mode and a reset mode determined in accordance with a second control signal in such a manner that in the set mode, it outputs the inverted signal of the output signal from said gate means while in the reset mode, it holds the output at the same potential as said prescribed potential;

first isolation means for controlling propagation of the output from said gate means to its succeeding stage;

second isolation means for controlling propagation of the output from said inverted signal outputting means to its succeeding stage;

first latch means for latching the output signal from said second isolation means, whereby the respective output signals from said first and said second latch means outputted as complementary signals, said inverted signal outputting means comprising:

an emitter-grounded bipolar transistor for producing an output signal at its collector potential;

first switching means coupled to said bipolar transistor for controlling the supply of a collector current to said bipolar transistor;

an n-channel MOS transistor connected in parallel between the base and the collector of said bipolar transistor, said n-channel MOS transistor for supplying a base current to said bipolar transistor in accordance with the non-inverted signal of an input digital signal;

second switching means coupled to said bipolar transistor for controlling the supply of said base current to said bipolar transistor;

said first and second switching means being selectively on-off controlled in accordance with said set mode and said reset mode.

9. A semiconductor memory circuit device according to claim 8, further comprising a first and a second refresh address inputting means for periodically renewing stored contents which are coupled between said first isolation means and said first latch means and between said second isolation means and said second latch means, respectively.

10. A semiconductor memory circuit device provided with an input buffer circuit comprising:

gate means for controlling an address input signal supplied from an external terminal in accordance with a first control signal and holding its output at a first prescribed potential during an input inhibiting period;

inverted signal outputting means having a set mode and a reset mode determined in accordance with a second control signal in such a manner that in the set mode, it outputs the inverted signal of the output signal from said gate means while in the reset mode, it holds the output at a second prescribed potential;

non-inverted signal outputting means having a set mode and a reset mode determined in accordance with a second control signal in such a manner that in the set mode, it outputs the non-inverted signal of the output signal from said gate means while in the reset mode, it holds the output at the same potential as said second prescribed potential;

first isolation means for controlling propagation of the output from said non-inverted signal inputting means to its succeeding stage;

second isolation means for controlling propagation of the output from said inverted signal outputting means to its succeeding stage;

first latch means for latching the output signal from said from isolation means; and second latch means for latching the output signal from said second isolation means, whereby the respective output signal from said first and said second latch means are outputted as complementary signal, said inverted signal outputting means comprising:

a first emitter-grounded bipolar transistor for producing an output signal at its collector potential;

first switching means coupled to said first bipolar transistor for controlling the supply of a collector current to said first bipolar transistor;

a first n-channel MOS transistor connected in parallel between the base and the collector of said first bipolar transistor, said first n-channel MOS transistor for supplying a base current to said first bipolar transistor in accordance with the non-inverted signal of an input digital signal;

second switching means coupled to said first bipolar transistor for controlling the supply of said base current to said first bipolar transistor;

said non-inverted signal outputting means comprising:

a second emitter-grounded bipolar transistor for producing an output signal at its collector potential;

third switching means coupled to said second bipolar transistor for controlling the supply of a collector current to said second bipolar transistor;

signal inverting means for producing the inverted signal of an input signal;

a second n-channel MOS transistor connected in parallel between the base and the collector of said second bipolar transistor, said second n-channel MOS transistor for supplying a base current to said second bipolar transistor in accordance with said inverted signal;

a first p-channel MOS transistor connected in parallel between the base and the collector of said second bipolar transistor, said first p-channel MOS transistor for supplying a base current to said second bipolar transistor in accordance with the non-inverted signal of an input digital signal;

fourth switching means coupled to said second bipolar transistor for controlling the supply of said base current to said second bipolar transistor;

said first and said third switching means, and said second and aid fourth switching means being selectively on-off controlled in accordance with said set mode and said reset mode.

11. A semiconductor memory circuit device according to claim 9, further comprising a first and a second refresh address inputting means for periodically renewing stored contents which are coupled between said first isolation means and said first latch means and between said second isolation means and said second latch means, respectively.

12. A semiconductor memory circuit device according to claim 10, further comprising a first and a second refresh address inputting means for periodically renewing stored contents which are coupled between said first isolation means and said first latch means and between said second isolation means and said second latch means, respectively.

13. A semiconductor memory circuit device according to claim 5, wherein said first and said second isolation means are switching means of a p-channel MOS transistor and an n-channel MOS transistor in a transfer connection so that signals at different logical levels are supplied to their gates to control signal propagation.

14. A buffer circuit device in which a MOS transistor circuit at an input stage drives a bipolar transistor circuit to produce an output signal, wherein said MOS transistor circuit comprises a first MOS transistor of a first conductivity type and a second MOS transistor of a second conductivity type, said first and second MOS transistors both being coupled to said bipolar transistor circuit; and wherein one of said first MOS transistor and said second MOS transistor is supplied with an input signal to said input stage to be on-off controlled, and the other of said first and second MOS transistors is supplied with an inverted signal of said input signal to be on-off controlled.

15. A buffer circuit device according to claim 14, wherein said first MOS transistor is a PMOS transistor and said second MOS transistor is an NMOS transistor.

16. A buffer circuit device according to claim 14, wherein said first MOS transistor is an NMOS transistor and said second MOS transistor is a PMOS transistor.

17. A buffer circuit device in which a MOS transistor circuit at an input stage drives a bipolar transistor circuit to produce an output signal, wherein said MOS transistor circuit comprises a first MOS transistor of a first conductivity type and a second MOS transistor of a second conductivity type, said first and second MOS transistors both being coupled to said bipolar transistor circuit; and wherein one of said first MOS transistor and said second MOS transistor is supplied with an input signal to said input stage to be on-off controlled, and the other of said first and second MOS transistors is supplied with an inverted signal of said input signal to be on-off controlled;

wherein said input signal and said output signal have substantially the same level.

18. A non-inverting buffer circuit device according to claim 1, wherein said input signal and said output signal have substantially the same level.

19. A non-inverting buffer circuit device according to claim 2, wherein said input signal and said output signal have substantially the same level.

20. A non-inverting buffer circuit device according to claim 3, wherein said input signal and said output signal have substantially the same level.

21. A buffer circuit device according to claim 14, wherein said first and second MOS transistors are both connected in parallel between a base and a collector of a bipolar transistor of said bipolar transistor circuit.

* * * * *